US011258023B1

(12) United States Patent
Ramsbey et al.

(10) Patent No.: US 11,258,023 B1
(45) Date of Patent: Feb. 22, 2022

(54) RESISTIVE CHANGE ELEMENTS USING PASSIVATING INTERFACE GAPS AND METHODS FOR MAKING SAME

(71) Applicants: Nantero, Inc., Woburn, MA (US); TOKYO ELECTRON LIMITED, Tokyo (JP)

(72) Inventors: Mark Ramsbey, Sunnyvale, CA (US); Thomas Rueckes, Byfield, MA (US); Tatsuya Yamaguchi, Yamanashi (JP); Syuji Nozawa, Yamanashi (JP); Nagisa Sato, Tokyo (JP)

(73) Assignee: Nantero, Inc., Woburn, MA (US)

( * ) Notice: Subject to any disclaimer, the term of this patent is extended or adjusted under 35 U.S.C. 154(b) by 8 days.

(21) Appl. No.: 16/985,657

(22) Filed: Aug. 5, 2020

(51) Int. Cl.
| | |
|---|---|
| *H01L 21/764* | (2006.01) |
| *H01L 51/10* | (2006.01) |
| *H01L 51/00* | (2006.01) |
| *H01L 27/28* | (2006.01) |
| *H01L 51/05* | (2006.01) |

(52) U.S. Cl.
CPC .......... *H01L 51/107* (2013.01); *H01L 27/285* (2013.01); *H01L 51/0003* (2013.01); *H01L 51/0017* (2013.01); *H01L 51/0048* (2013.01); *H01L 51/0591* (2013.01)

(58) Field of Classification Search
CPC ............... H01L 21/764; H01L 27/1052; H01L 27/10844
See application file for complete search history.

(56) References Cited

U.S. PATENT DOCUMENTS

| | | | | |
|---|---|---|---|---|
| 2009/0101883 A1* | 4/2009 | Lai | .......... | H01L 45/148 257/3 |
| 2014/0246724 A1* | 9/2014 | Jang | .......... | H01L 27/10894 257/368 |
| 2015/0228754 A1* | 8/2015 | Sung | .......... | H01L 29/6653 438/595 |
| 2016/0181143 A1* | 6/2016 | Kwon | .......... | H01L 21/7682 438/586 |
| 2020/0006652 A1* | 1/2020 | Cheng | .......... | H01L 45/14 |

* cited by examiner

Primary Examiner — Jae Lee
(74) Attorney, Agent, or Firm — Nantero, Inc.

(57) ABSTRACT

A method to fabricate a resistive change element. The method may include forming a stack over a substrate. The stack may include a conductive material, a resistive change material, a first surface, and a second surfaces opposite the first surface. The method may further include depositing a first material over the stack such that the first material directly contacts at least one of the first surface and the second surface of the stack. The method may also include after depositing the first material, forming a second material over the first material and evaporating a portion of the first material through the second material to create a gap between the second material and the at least one of the first surface and the second surface of the stack.

23 Claims, 14 Drawing Sheets

RESISTIVE CHANGE ELEMENTS USING PASSIVATING INTERFACE GAPS AND METHODS FOR MAKING SAME

TECHNICAL FIELD

The present disclosure relates generally to resistive change elements and, more specifically, to methods for fabricating resistive change elements with gaps separating the sidewalls of the resistive change material and protective insulating material deposited over the resistive change elements.

CROSS-REFERENCE TO RELATED APPLICATIONS

This application is related to the following U.S. Patents, which are assigned to the assignee of the present application, and are hereby incorporated by reference in their entirety:

U.S. Pat. No. 6,835,591, filed on Apr. 23, 2002, entitled Methods of Nanotube Films and Articles;

U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;

U.S. Pat. No. 6,706,402, filed on Mar. 16, 2004, entitled Nanotube Films and Articles;

U.S. Pat. No. 7,115,901, filed on Jun. 9, 2004, entitled Non-Volatile Electromechanical Field Effect Devices and Circuits Using Same and Methods of Forming Same;

U.S. Pat. No. 7,365,632, filed on Sep. 20, 2005, entitled Resistive Elements Using Carbon Nanotubes;

U.S. Pat. No. 7,781,862, filed on Nov. 15, 2005, entitled Two-Terminal Nanotube Devices and Systems and Methods of Making Same;

U.S. Pat. No. 7,479,654, filed on Nov. 15, 2005, entitled Memory Arrays Using Nanotube Articles with Reprogrammable Resistance;

U.S. Pat. No. 8,217,490, filed on Aug. 8, 2007, entitled Nonvolatile Nanotube Diodes and Nonvolatile Nanotube Blocks and Systems Using Same and Methods of Making Same;

U.S. Pat. No. 7,835,170, filed on Aug. 8, 2007, entitled Nonvolatile Nanotube Diodes and Nonvolatile Nanotube Blocks and Systems Using Same and Methods of Making Same;

U.S. Pat. No. 8,102,018, filed on Aug. 8, 2007, entitled Nonvolatile Resistive Memories Having Scalable Two-Terminal Nanotube Switches;

U.S. Pat. No. 9,287,356, filed on Jan. 20, 2009, entitled Nonvolatile Nanotube Diodes and Nonvolatile Nanotube Blocks and Systems Using Same and Methods of Making Same;

U.S. Pat. No. 8,319,205, filed on Aug. 6, 2009, entitled Nonvolatile Nanotube Programmable Logic Devices and a Nonvolatile Nanotube Field Programmable Gate Array Using Same;

U.S. Pat. No. 8,351,239, filed on Oct. 23, 2009, entitled Dynamic Sense Current Supply Circuit and Associated Method for Reading and Characterizing a Resistive Memory Array;

U.S. Pat. No. 8,000,127, filed on Nov. 13, 2009, entitled Method for Resetting a Resistive Change Memory Element;

U.S. Pat. No. 8,619,450, filed on Sep. 1, 2010, entitled A Method for Adjusting a Resistive Change Element Using a Reference;

U.S. Pat. No. 8,941,094, filed on Sep. 2, 2010, entitled Methods for Adjusting the Conductivity Range of a Nanotube Fabric Layer;

U.S. Pat. No. 9,422,651, filed on Mar. 30, 2011, entitled Methods for Arranging Nanoscopic Elements Within Networks, Fabrics, and Films;

U.S. Pat. No. 9,390,790, filed on Dec. 17, 2012, entitled Carbon Based Nonvolatile Cross Point Memory Incorporating Carbon Based Diode Select Devices And MOSFET Select Devices For Memory And Logic Applications;

U.S. Pat. No. 9,337,423, filed on Feb. 27, 2015, entitled Two-Terminal Switching Device Using a Composite Material of Nanoscopic Particles and Carbon Nanotubes; and U.S. Pat. No. 10,355,206, filed on Apr. 12, 2017, entitled Sealed Resistive Change Elements.

BACKGROUND

Resistive change devices are well known in the semiconductor and electronics industry. Such devices, for example, include, but are not limited to, phase change memory, solid electrolyte memory, metal oxide resistance memory, and carbon nanotube memory such as NRAM™.

Resistive change devices store information by adjusting a resistive change material, between a number of non-volatile resistive states in response to some applied stimuli, within each individual array cell between two or more resistive states. Resistive change material may be used in a variety of different devices, including memory devices, analog circuitry, and logic devices, among other types of devices.

Any discussion of the related art throughout this specification should in no way be considered as an admission that such art is widely known or forms part of the common general knowledge in the field. Additionally, the subject matter claimed herein is not limited to embodiments that solve any disadvantages or that operate only in environments such as those described above. Rather, this background is only provided to illustrate one example technology area where some embodiments described herein may be practiced.

SUMMARY OF THE DISCLOSURE

The current disclosure relates to methods of forming resistive change elements with air or vacuum gaps separating the resistive change material from later deposited protective material.

In particular, the present disclosure provides a first method to fabricate a resistive change element. This method first comprises forming a stack over a substrate. The stack may include a conductive material, a resistive change material, a first surface, and a second surfaces opposite the first surface. The method further comprises depositing a first material over the stack such that the first material directly contacts at least one of the first surface and the second surface of the stack. After depositing the first material, the method further comprises forming a second material over the first material and evaporating a portion of the first material through the second material to create a gap between the second material and the at least one of the first surface and the second surface of the stack.

The present disclosure also provides a second method to fabricate a resistive change element. This method first comprises forming a first conductive material over a substrate, depositing a resistive change material over the first conductive material, then forming a second conductive material over the resistive change material. This method further comprises exposing a first surface and a second surface of the resistive change material while the resistive change material remains between the first conductive material and the second conductive material. After exposing the first surface and second surface of the resistive change material, this method further comprises: (1) depositing an evaporative material in direct contact with the exposed first surface and second surface of the resistive change material; (2) forming a cover material over the evaporative material; and (3) evaporating a portion of the evaporative material through the cover material to create a gap between the cover material and the first and second surface of the resistive change material.

According to one aspect of the present disclosure, the resistive change material is a nanotube fabric.

Under another aspect of the present disclosure, the resistive change material is a phase change material.

Under another aspect of the present disclosure, the resistive change material is a metal oxide material.

Under another aspect of the present disclosure, the gap is filled with a gas (such as, but not limited to, air).

Under another aspect of the present disclosure, the gap is a vacuum.

Other features and advantages of the present invention will become apparent from the following description of the invention which is provided below in relation to the accompanying drawings.

BRIEF DESCRIPTION OF THE DRAWINGS

Example embodiments will be described and explained with additional specificity and detail through the use of the accompanying drawings in which.

DETAILED DESCRIPTION

The present disclosure relates to resistive change elements. A resistive change element may include an element stack that includes a resistive change material between two conductors. A portion of the element stack may be covered by an insulative material. The resistive change element described in this disclosure may include a protective, passivating gap between sidewalls of the resistive change material and the insulative material. The gap may be filled with a gas (e.g. air) or may be a vacuum. This passivating gap between the resistive change element and the insulative material may help prevent the insulative material from binding to or penetrating the resistive change element thereby changing the properties of the resistive change element that may affect the operation of the resistive change element.

The present disclosure also relates to a method to form a resistive change element with the gap between the resistive change element and the insulative material. In some embodiments, the element stack may be formed by a resistive change material between two conductors. Sidewalls of the resistive change material may be exposed. An evaporative material may be deposited on the exposed sidewalls of the resistive change material. The deposition of the evaporative material may place the evaporative material in direct contact with the exposed sidewalls of the resistive change material. Alternately or additionally, the evaporative material may penetrate into the resistive change material through the exposed sidewalls of the resistive change material.

After depositing the evaporative material, the insulative material may be formed over and in direct contact with the evaporative material. The evaporative material may be evaporated through the insulative material to form the gap in the resistive change element between the insulative material and the resistive change material. Additional material may be deposited onto the insulative material after the evaporative material is removed. In these and other embodiments, the insulative material may assist in preventing the additional material from entering or filling the gap during the remainder of the fabrication of the resistive change element. As a result, the gap may be maintained between the insulative material and the resistive change material after fabrication of the resistive change element. The gap may reduce other materials from binding to, penetrating, or otherwise interfering with the resistive change material or affecting properties of the resistive change material that may affect the operation of the resistive change element.

Figure 1:
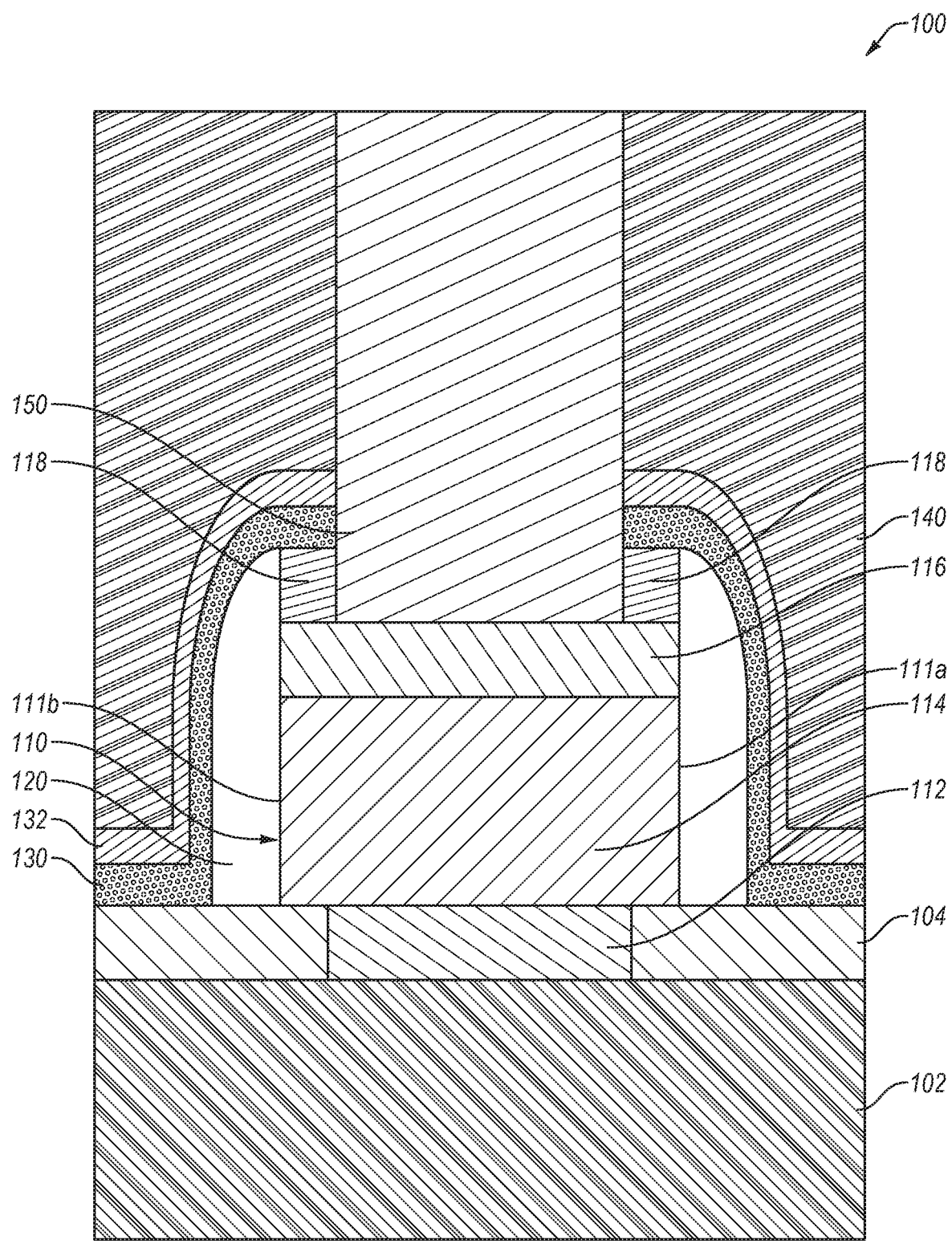
FIG. 1 is a cross-sectional view of a resistive change element.

Turning to the figures, FIG. 1 is a cross-sectional view of a resistive change element 100. The resistive change element 100 may be arranged in accordance with at least one embodiment described in the present disclosure. In some embodiments, the resistive change element 100 may be fabricated using deposition, etching, patterning, and lithography techniques that are well understood by one skilled in the nanometer and sub-nanometer microelectronics fabrication arts. As illustrated in FIG. 1, the resistive change element 100 is formed on a substrate 102.

The substrate 102 may include an unprocessed semiconductor substrate. Alternately or additionally, the substrate 102 may include a semiconductor substrate with various process layers formed thereon including one or more semiconductor layers or other formations, and active or operable portions of semiconductor devices such as transistors, capacitors, electrodes, insulators, or any of a variety of components commonly utilized in semiconductor structures. The substrate 102 may include a semiconductive material such as monocrystalline silicon, polycrystalline silicon, germanium, and/or gallium arsenide. Alternately or additionally, the substrate 102 may include one or more epitaxial layers of silicon supported by a base semiconductor foundation. Alternately or additionally, the substrate 102 may be formed or include silicon-on-sapphire (SOS) technology, silicon-on-insulator (SOI) technology, thin film transistor (TFT) technology, or any support structure with appropriate thermal conductivity and mechanical support for the resistive change element 100.

The resistive change element 100 may include an element stack 110. The element stack 110 may include a first conductive material 112, a second conductive material 116, a resistive change material 114, and a second insulative material 118.

In some embodiments, the element stack 110 may be configured to store information by way of the resistive change material 114. In these and other embodiments, the resistive change material 114, responsive to electrical stimulus, may be adjusted between at least two non-volatile resistive states. In some embodiments, two resistive states may be used: a low resistive state and a high resistive state. In these and other embodiments, the low resistive state may correspond to a logic '1,' or a SET state and the high resistive state may correspond to a logic '0,' or a RESET state, or vice versa. The resistive change material 114 including two non-volatile resistive states may allow the element stack 110 to be used to a store a bit of information. Thus, the element stack 110 may function as a 1-bit memory element. Alternately or additionally, the resistive change material 114 may include more than two non-volatile resistive states. As a result, the element stack 110 may be used to a store more than one bit of information. For example, the resistive change material 114 may include four non-volatile resistive states such that the element stack 110 may store two bits of information.

In some embodiments, the resistive change element 100, that includes the element stack 110, may be used as part of a non-volatile memory devices for storing digital data (storing logic values as resistive states) within electronic devices (such as, but not limited to, cell phones, digital cameras, solid state hard drives, and computers). However, the resistive change element 100 may not be limited to memory applications. The resistive change element 100, as well as the advanced architectures taught by the present disclosure, may also be used within logic devices or within analog circuitry.

In some embodiments, the resistive change material 114, may be adjusted, e.g. programmed, between different resistive states by applying an electrical stimulus across the resistive change element. For example, one or more first programming pulses of a particular voltage, current, and/or pulse width may be applied across a resistive change element to adjust the electrical resistance of the resistive change element from a first resistance state to a second resistance state. One or more second programming pulses may be used to adjust the electrical resistance of the resistive change material 114 back to the first resistive state or a third resistive state.

In some embodiments, a resistive state of the resistive change material 114 may be determined by applying a DC test voltage across the resistive change material 114 and measuring the current through the resistive change material 114. In these and other embodiments, the current through the resistive change material 114 may be measured using a power supply with a current feedback output. For example, the current feedback output may be a programmable power supply or a sense amplifier. Alternately or additionally, the current through the resistive change material 114 may be measured by inserting a current measuring device in series with the resistive change material 114.

Alternately or additionally, a resistive state of the resistive change material 114 may also be determined by driving a fixed DC current through the resistive change material 114 and measuring the resulting voltage across the resistive change material 114. When measuring a voltage across or a current through the resistive change material 114, the electrical stimulus applied to the resistive change material 114 may be limited such as to not alter the resistive state of the resistive change material 114. As a result, a current resistive state of the resistive change material 114 may be determined without altering the current resistive state of the resistive change material 114. For example, when the resistive change material 114 is configured as a memory cell, the state of the resistive change material 114 may be determined through a read operation without disrupting the current resistive state. As a result, performing a read operation does not result in a subsequent write operation to reprogram the resistive change material 114.

In some embodiments, the resistive change material 114 may include materials including: metal oxide, solid electrolyte, phase change material such as a chalcogenide glass, and carbon nanotube fabrics. For example, U.S. Pat. No. 7,781,862 to Bertin et al., incorporated herein by reference in its entirety, discloses a two terminal nanotube switching device that includes a nanotube fabric layer. Bertin discloses methods for adjusting the resistivity of the nanotube fabric layer between multiple nonvolatile resistive states. In some embodiments, electrical stimulus may be applied to the nanotube fabric layer to pass an electric current through the nanotube fabric layer. Bertin explains that the electrical stimulus may be controlled within a certain set of particular parameters such that the resistivity of the nanotube fabric layer may be repeatedly switched between a first resistive state and a second resistive state, which may be used to store information as discussed above.

In some embodiments, a nanotube fabric layer may include a layer of multiple, interconnected carbon nanotubes. In these and other embodiments, the multiple, interconnected carbon nanotubes may have a structure of multiple entangled nanotubes that are irregularly arranged relative to one another. As a result, the nanotube fabric layer may be considered as a non-woven carbon nanotube (CNT) fabric.

Alternately or additionally, the multiple, interconnected carbon nanotubes of the nanotube fabric layer may possess some degree of positional regularity. For example, the nanotubes may include some degree of parallelism along long axes of the nanotubes. In some embodiments, the positional regularity may be found on a relatively small scale. For example, flat arrays of nanotubes may be arranged together along the long axes of the nanotubes in rafts on the order of one nanotube long and ten to twenty nanotubes wide. Alternately or additionally, the positional regularity may be found on a larger scale. For example, the positional regularity may be found with regions of ordered nanotubes that may extend over substantially the entire fabric layer.

In some embodiments, the resistive change material 114 may be located between the first conductive material 112 and the second conductive material 116. The first conductive material 112 may be between the substrate 102 and the resistive change material 114. The second conductive material 116 may be between the resistive change material 114 and the second insulative material 118. In some embodiments, the first conductive material 112 and the second conductive material 116 may be configured as electrodes for the resistive change material 114. In these and other embodiments, the first conductive material 112 and the second conductive material 116 may be in direct electrical communication with the resistive change material 114 such that a voltage or current at the first conductive material 112 or the second conductive material 116 may pass to the resistive change material 114.

In some embodiments, the element stack 110 may include additional materials. For example, one or more conductive materials may be located between the first conductive material 112 and the resistive change material 114 and/or between the resistive change material 114 and the second conductive material 116. In some embodiments, additionally materials may be between the first conductive material 112 and the substrate 102. Alternately or additionally, the element stack 110 may include one or more materials between the second conductive material 116 and the second insulative material 118 and/or between the second insulative material 118 and the first cover material 130.

In some embodiments, the materials of the element stack 110 may extend in a lengthwise direction that is parallel to the surface of the substrate 102 that is adjacent to the element stack 110. In these and other embodiments, each of two or more of the materials of the element stack 110 may extend a substantially same length in the lengthwise direction. For example, the second insulative material 118, the second conductive material 116, and the resistive change material 114 may extend the substantially same length in the lengthwise direction. A length of the first conductive material 112 may be less than the length of the other materials of the element stack 110 in the lengthwise direction. Alternately or additionally, other materials of the element stack 110 may be of varying length. For example, the first conductive material 112 and the second conductive material 116 may each have a length less than a length of the resistive change material 114.

In some embodiments, the element stack 110 may include a first sidewall 111a and a second sidewall 111b, referred to collectively as the sidewalls 111. The sidewalls 111 of the element stack 110 may be substantially perpendicular to the surface of the first conductive material 112 that is adjacent to the substrate 102. The sidewalls 111 may not be planar as the lengths of each of the materials of the element stack 110 may not be equal. For example, the length of the first conductive material 112 may be shorter than the resistive change material 114 such that sidewalls of the resistive change material 114 are parallel to but not planar with sidewalls of the first conductive material 112.

In some embodiments, a portion of the sidewalls 111 of the element stack 110 may be free from direct contact with any material of the resistive change element 100. In these and other embodiments, the portion of the sidewalls 111 that may be free from direct contact with any material may be directly adjacent to a gap 120 between the element stack 110 and a first cover material 130 that may be over the element stack 110. In some embodiments, there may be no material between the first cover material 130 and the element stack 110. Alternately or additionally, there may be a portion of the material used to form the gap 120 as described with respect to FIGS. 2A-2H that remains between the first cover material 130 and the element stack 110 after formation of the gap 120, however no other material may be between the first cover material 130 and the element stack 110. In some embodiments, the gap 120 may be filled with air or may be a vacuum.

The portion of the sidewalls 111 that may be directly adjacent to gap 120 may include sidewalls of the resistive change material 114 that form the sidewalls 111. Other portions of the sidewalls 111 that may be directly adjacent the gap 120 may include sidewalls of the second conductive material 116 and sidewalls of the second insulative material 118. Alternately or additionally, some or all of the sidewalls of the second insulative material 118 may be in direct contact with the first cover material 130. Alternately or additionally, some or all of the sidewalls of the second conductive material 116 may be in direct contact with the first cover material 130. In these and other embodiments, the gap 120 may be between at least the sidewalls of the resistive change material 114 and the first cover material 130. As such, no material or only material used to create the gap 120 may be in contact with the resistive change material 114.

In some embodiments, by reducing the material in contact with the sidewalls of the resistive change material 114, the properties of the resistive change material 114 that allow the resistive change material 114 to adjusted between non-volatile resistive states may be maintained. For example, if material contacts sidewalls or penetrates the sidewalls of the resistive change material 114 during formation of the resistive change element 100, an ability of the resistive change material 114 to change between non-volatile resistive states may be affected. For example, when the resistive change material 114 is a nanotube fabric material, other materials on the sidewalls of or that penetrates into the resistive change material 114 may bind the nanotubes. Binding of the nanotubes may prevent the nanotubes from changing their relative positions by application of an electrical current or voltage. As such, the resistive state of the resistive change material 114 may not be able to change or may have a reduction in an amount of change that may occur such that a difference between the resistive change material 114 is not perceivable or more difficult to perceive thereby hampering the use of the resistive change material 114 to adjust between non-volatile resistive states.

As illustrated in FIG. 1, sidewalls of the first insulative material 104 may be surrounded by and a first insulative material 104. In these and other embodiments, the first insulative material 104 may be between the substrate 102 and the first cover material 130. With the length of the first conductive material 112 being less than the length of the resistive change material 114, a portion of a surface of the resistive change material 114 adjacent to the substrate 102 may be adjacent to the first insulative material 104. In these and other embodiments, the portion of the surface of the resistive change material 114 may be in direct contact with the first insulative material 104.

In some embodiments, the first insulative material 104 may be between the element stack 110 and the substrate 102. The first insulative material 104 may separate and insulate the element stack 110 and the other materials surrounding the element stack 110 from additional materials that may be formed on in the substrate 102. The additional materials may include conductors, such as metals layers, transistors, capacitors, electrodes, insulators, or any of a variety of components, that may be formed in conjunction with the resistive change element 100. For example, the additional materials may be conductors that may be used as bit lines and components for electrically accessing the resistive change element 100.

In some embodiments, the gap 120 may be between a portion or an entirety of the sidewall of the first conductive material 112 and the first cover material 130. In these and other embodiments, the resistive change element 100 may not include the first insulative material 104 or the first conductive material 112 may be formed over the first insulative material 104 such that the first insulative material 104 is directly between the first conductive material 112 and the substrate 102.

In some embodiments, a second cover material 132 may be over the first cover material 130 such that the first cover material 130 is between the gap 120 and the second cover material 132. The second cover material 132 may be in direct contact with the first cover material 130.

In some embodiments, a third insulative material 140 may be over the second cover material 132 such that the second cover material 132 is between the third insulative material 140 and the first cover material 130. The third insulative material 140 may separate and insulate the element stack 110 and the other materials surrounding the element stack 110 from additional materials that may be formed over the element stack 110. The additional materials may include conductors, such as metals layers, transistors, capacitors, electrodes, insulators, or any of a variety of components, that may be formed in conjunction with the resistive change element 100. For example, the additional materials may be conductors that may be used as bit lines and components for electrically accessing the resistive change element 100.

A third conductive material 150 may extend between through the second insulative material 118, the first cover material 130, and the second cover material 132 and may be electrically coupled to the second conductive material 116. In some embodiments, the third conductive material 150 may be in direct contact with the second conductive material 116. Alternately or additionally, one or more materials may be between the third conductive material 150 and the second conductive material 116 but the third conductive material 150 may maintain directly electrically coupled to the second conductive material 116 through the one or more materials. The third conductive material 150 may act as a conductive via that may electrically couple the element stack 110, including the resistive change material 114, to one or more circuits configured to determine and/or alter a resistive state of the resistive change material 114.

Modifications, additions, or omissions may be made to the resistive change element 100 without departing from the scope of the present disclosure. For example, in some embodiments, the resistive change element 100 may include one more additional materials between the first cover material 130 and the third insulative material 140. Alternately or additionally, the resistive change element 100 may include one or more materials between the resistive change element 100 and the element stack 110 and the first cover material 130. Alternately or additionally, the element stack 110 may include one or more additional materials than those illustrated in FIG. 1.

As another example, the substrate 102 may include one or more conductive materials that may be configured to electrically couple the first conductive material 112 to one or more circuits configured to determine and/or alter a resistive state of the resistive change material 114.

As another example, the substrate 102 may support more than one resistive change element 100. In these and other embodiments, multiple resistive change elements may be formed on the substrate 102. In these and other embodiments, the multiple resistive change elements may be arranged to form a non-volatile memory that may be randomly accessed to read and write data in the multiple resistive change elements. In these and other embodiments, the multiple resistive change elements may be arranged in any configuration such as horizontal rows, columns, and/or vertical columns to achieve a desired density of the multiple resistive change elements on the substrate 102.

Figure 2A:
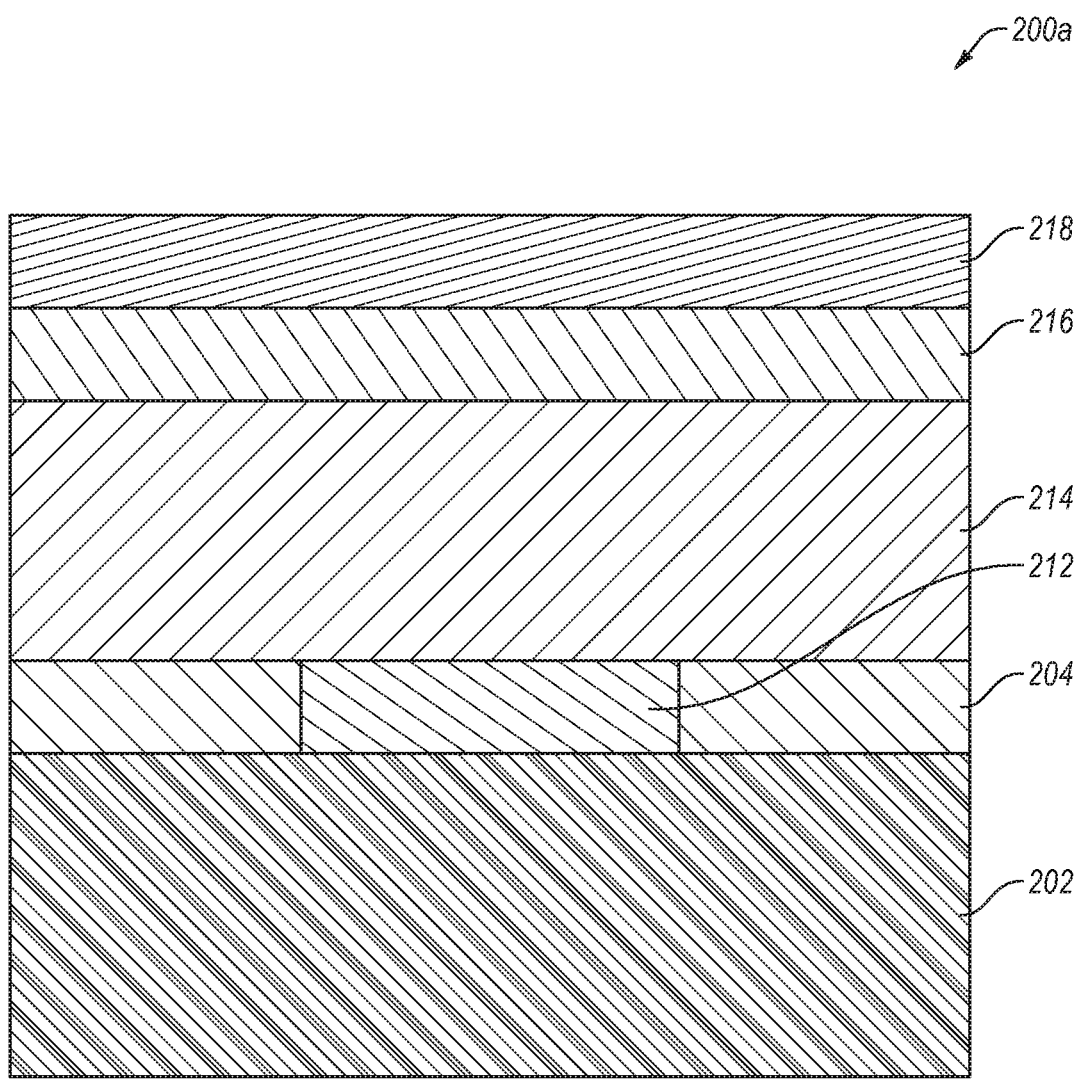
FIG. 2A is a cross-sectional view of multiple layers during fabrication of a resistive change element.

FIGS. 2A-2H illustrate various stages of a resistive change element during an example method to fabricate the resistive change element. For example, FIG. 2A is a cross-sectional view of multiple layers during fabrication of a resistive change element 200a arranged in accordance with at least one embodiment described in the present disclosure.

The resistive change element 200a may include a substrate 202, a first insulation layer 204, a first conductive electrode 212, a resistive change layer 214, a second conductive layer 216, and a second insulation layer 218.

In some embodiments, the substrate 202 may be analogous to the substrate 102 and thus no further description is provided with respect to FIG. 2A.

In some embodiments, the first insulation layer 204 and the second insulation layer 218 may be formed from insulation material. For example, the insulation material may include one or more insulation materials including: silicon dioxide ($SiO_2$), silicon nitride ($SiN_X$), a silicate glass (doped or un-doped), other suitable dielectric material such as a low dielectric constant (i.e., low-k) material, or combinations thereof. In some embodiments, each of the first insulation layer 204 and the second insulation layer 218 may be formed from the same material or each of the first insulation layer 204 and the second insulation layer 218 may be formed by a different insulation material.

In some embodiments, the first insulation layer 204 and the second insulation layer 218 may be deposited by any one of a number of deposition techniques. For example, the first insulation layer 204 and the second insulation layer 218 may be deposited using physical vapor deposition (PVD) (evaporation, sputtering or ablation of the film-forming material), chemical vapor deposition (CVD), in which gases, evaporating liquids, or chemically gasified solids are used as the source material, among other techniques such as vapor phase epitaxy (VPE) or a spin-on dielectric (SOD) process.

In some embodiments, the resistive change layer 214 may be formed from a resistive change material including: metal oxide, solid electrolyte, phase change material such as a chalcogenide glass, and carbon nanotube fabrics. In these and other embodiments, the carbon nanotube fabrics may be analogous to the nanotube fabrics described with respect to FIG. 1.

In some embodiments, the resistive change layer 214 may be deposited by PVD, CVD, or a VPE process. Alternately or additionally, the resistive change layer 214 may be deposited by solution depositing the material and spin coating the material to form the resistive change layer 214. The type of process used to form the resistive change layer 214 may depend on the resistive change material used to form the resistive change layer 214.

The first conductive electrode 212 and the second conductive layer 216 may be formed of a conductive material, such as titanium nitride TiN, Tantalum nitride TaN, Tungsten W, Cobalt C, and doped poly, among other conductive materials. The deposition process to form the first conductive electrode 212 and the second conductive layer 216 may be performed by CVD, PECVD, or ALD, among other deposition processes.

To form the resistive change element 200a, the first insulation layer 204 may be deposited on and in direct contact with the substrate 202. After deposition of the first insulation layer 204, the first insulation layer 204 may be etched and the first conductive electrode 212 may be formed. Alternately or additionally, the first conductive electrode 212 may be formed and etched. After forming and etching the first conductive electrode 212, the first insulation layer 204 may be formed. A planarization may be performed after forming the first insulation layer 204 and the first conductive electrode 212 such that the first insulation layer 204 and the first conductive electrode 212 have a similar height from a surface of the substrate 202.

After formation of the first insulation layer 204 and the first conductive electrode 212, the resistive change layer 214 may be deposited, followed by the second conductive layer 216. After deposition of the second conductive layer 216, the second insulation layer 218 may be formed.

Modifications, additions, or omissions may be made to the resistive change element 200a without departing from the scope of the present disclosure. For example, in some embodiments, the resistive change element 200a may include more than the layers illustrated in FIG. 2a. For example, the resistive change layer 214 may include multiple resistive change layers. In these and other embodiments, the multiple resistive change layers may be the same or different types of materials and/or configurations of the same material. For example, with respect to different configurations of the same material, a first resistive change layer may include nanotubes that are randomly placed and a second resistive change layer may include nanotubes that have more organized, i.e., they are aligned more than the nanotubes in the first resistive change layer.

As another example, the first conductive electrode 212 and the second conductive layer 216 may be formed by one or more materials deposited in one or more steps. Alternately or additionally, the first insulation layer 204 and the second insulation layer 218 may be formed from multiple insulation layers. In these and other embodiments, each of the multiple insulation layers may be formed from the same or different insulation material.

As another example, the resistive change element 200a may include additional layers. For example, the resistive change element 200a may include additional layers between the first conductive electrode 212 and the resistive change layer 214 and/or additional layers between the second conductive layer 216 and the resistive change layer 214.

As another example, the resistive change element 200a may not include the second insulation layer 218. Alternately or additionally, the first conductive electrode 212 may not be embedded in the first insulation layer 204.

Figure 2B:
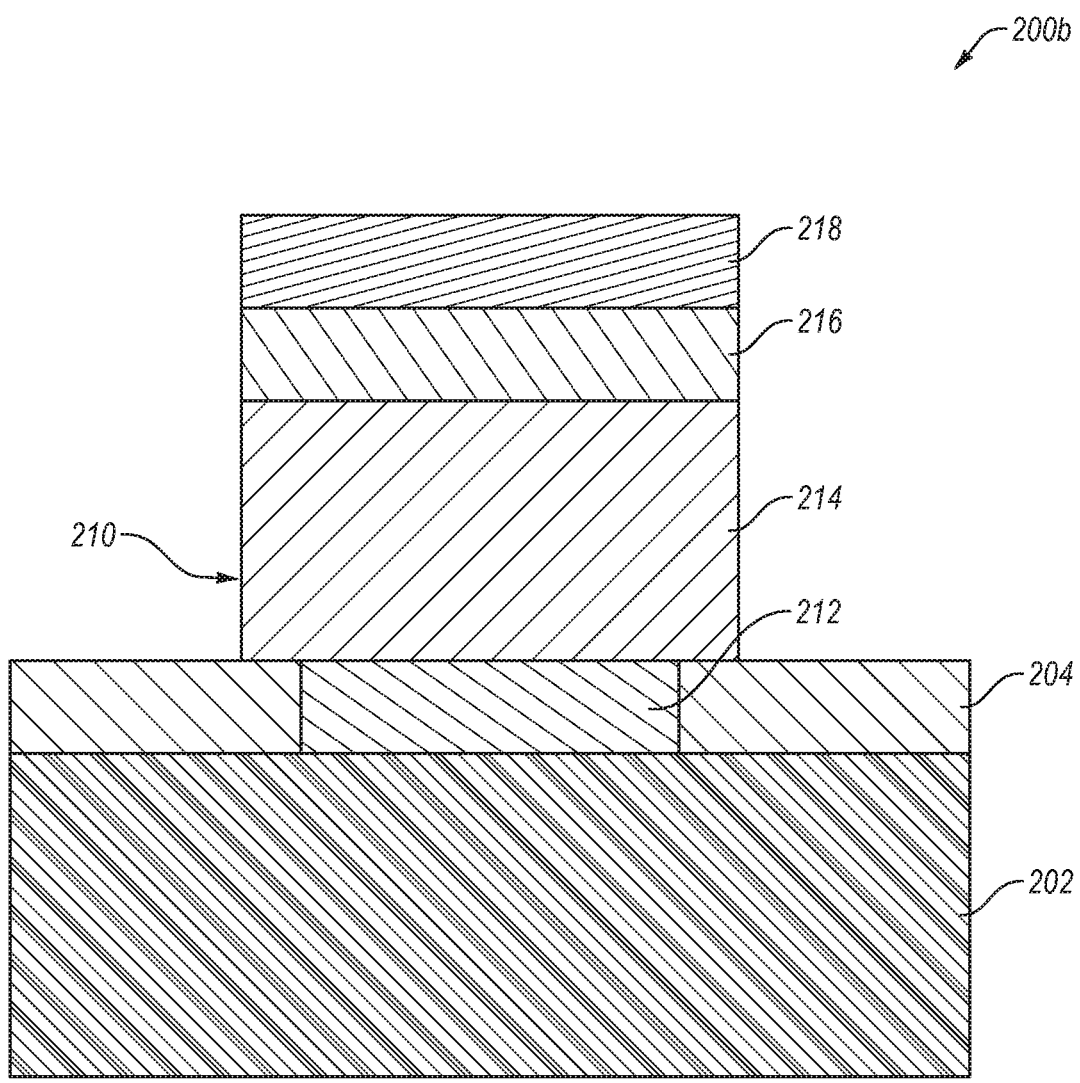
FIG. 2B is a cross-sectional view of a stack during fabrication of a resistive change element.

FIG. 2B is a cross-sectional view of a stack 210 during fabrication of a resistive change element 200b arranged in accordance with at least one embodiment described in the present disclosure.

The stack 210 may be formed by etching the resistive change element 200a formation illustrated in FIG. 2A. The formation of the stack 210 may include multiple process steps. For example, one or more mask materials, such as resists or hard mask materials, may be formed on the second insulation layer 218. The mask materials may be shaped using one or more lithography process and photomasks.

After shaping the mask materials, the stack 210 may be formed by etching the resistive change layer 214, the second conductive layer 216, and the second insulation layer 218 using the mask material. In some embodiments, the etching may be performed using a reactive ion etch (ME), a physical bombardment etch (e.g., nonreactive sputtering), a chemical etch, or some combination of these and other etch methods. Alternately or additionally, different etching processes may be used to etch the stack 210. For example, a first etching process with a first mask may be used to etch the second insulation layer 218. A second etching process with a second mask may be used to etch the resistive change layer 214 and the second conductive layer 216. Alternately or additionally, a different etching process and masks may be used to etch the resistive change layer 214 and the second conductive layer 216. The etching process may be wet, dry, or isotropic etching process, among other types of etching processes.

The stack 210 may be formed such that a width of the stack in a direction parallel to the surface of the substrate 202 adjacent to the stack 210 is larger than a width of the first conductive electrode 212 in the same direction.

Modifications, additions, or omissions may be made to the resistive change element 200b without departing from the scope of the present disclosure. For example, the width of the stack 210 may be larger than or equal in size to the width of the first conductive electrode 212.

Figure 2C:
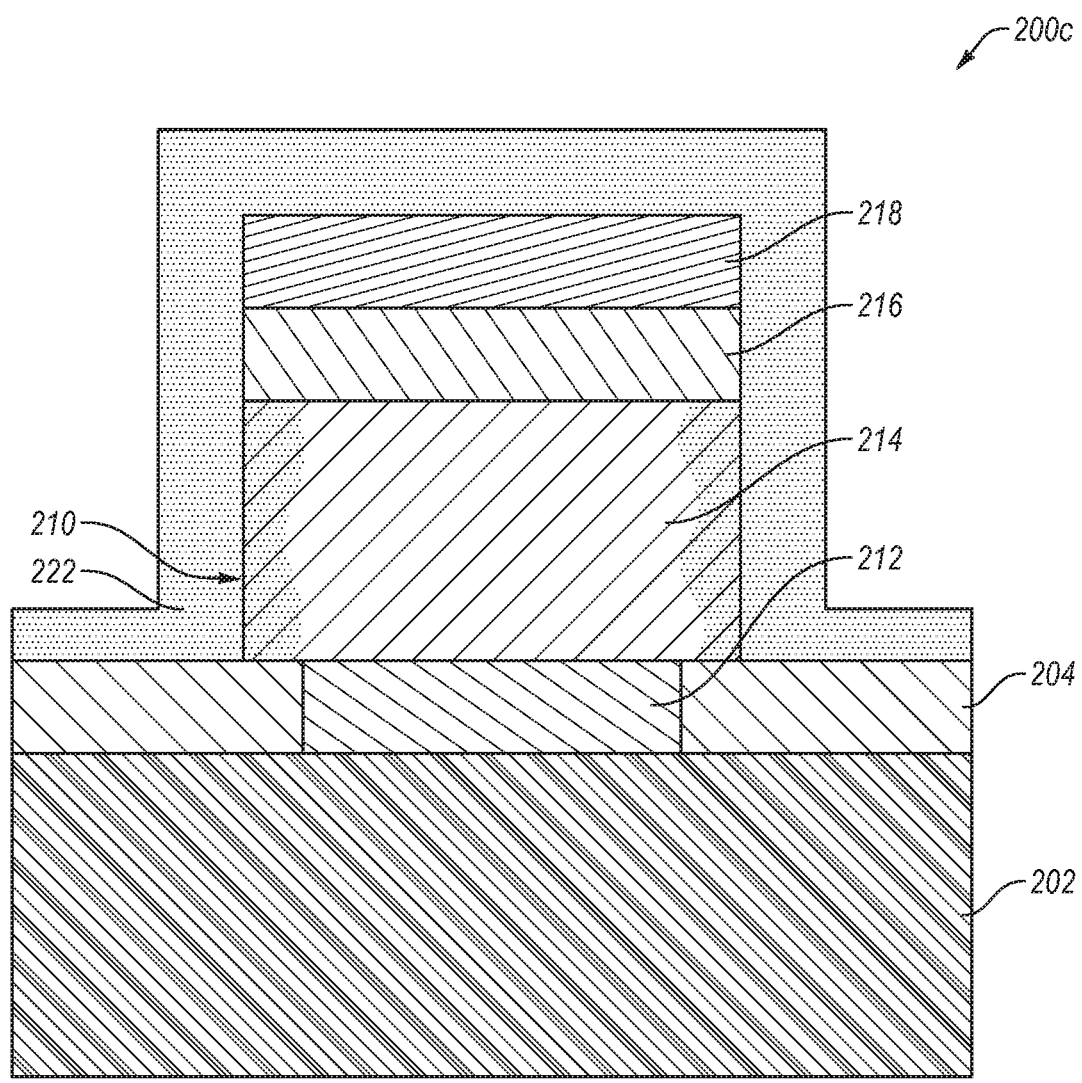
FIG. 2C is a cross-sectional view of an evaporative material over a stack during fabrication of a resistive change element.

FIG. 2C is a cross-sectional view of an evaporative material 222 over the stack 210 during fabrication of a resistive change element 200c arranged in accordance with at least one embodiment described in the present disclosure. The resistive change element 200c illustrates the evaporative material 222 formed over the stack 210. In these and other embodiments, the evaporative material 222 may be formed such that the evaporative material 222 is in direct contact with sidewalls of the stack 210.

In some embodiments, the evaporative material 222 may be in direct contact with the sidewalls of the stack 210 that are formed by sidewalls of the resistive change layer 214. Alternately or additionally, the evaporative material 222 may be in direct contact with the sidewalls of the resistive change layer 214 and some or all of sidewalls of the second conductive layer 216. Alternately or additionally, the evaporative material 222 may be in direct contact with the sidewalls of the resistive change layer 214, the second conductive layer 216, and some or all of sidewalls of the second insulation layer 218. In some embodiments, the first conductive electrode 212 may not be embedded in the first insulation layer 204. In these and other embodiments, the evaporative material 222 may be in direct contact with the sidewalls of the resistive change layer 214, some or all of the sidewalls of the first conductive electrode 212, and/or of sidewalls of other materials of the stack 210.

In some embodiments, a thickness of the evaporative material 222 may be in a range of 0.1 nm to 50 nm. As another example, the evaporative material 222 may include a thickness that is in a range from 0.5 nm to 30 nm, 1 nm to 20 nm, 2 nm to 10 nm, or some other value therebetween.

In some embodiments, the evaporative material 222 may penetrate the resistive change layer 214. As illustrated in FIG. 2C, the evaporative material 222 may penetrate the sidewalls of the evaporative material 222 such that the evaporative material 222 is within the resistive change layer 214 and thus within the sidewalls of the stack 210. In these and other embodiments, the evaporative material 222 may penetrate to a depth from the sidewalls of the resistive change layer 214 that is equal to approximately the thickness of the evaporative material 222. Alternately or additionally, the evaporative material 222 may penetrate to a depth in a range between 0.1 nm to 20 nm or some other value therebetween. In some embodiments, based on the width of the resistive change layer 214, the evaporative material 222 may penetrate through the entirety of the evaporative material 222 such that the evaporative material 222 may be found throughout an entire width of the resistive change layer 214.

The evaporative material 222 may be formed by an organic material. In some embodiments, the organic material may be a polymer material that may be thermally removed through evaporation. For example, the organic material may include an amine function group and/or an isocyanate functional group. As an example, the evaporative material 222 may be polyurea, but other polymer materials may be used. The evaporative material 222 may be deposited by any one of a number of deposition techniques, include PVD, CVD, VPE, or other deposition techniques depending on the type of material used for the evaporative material 222.

Modifications, additions, or omissions may be made to the resistive change element 200c without departing from the scope of the present disclosure. For example, in some embodiments, the evaporative material 222 may not penetrate the resistive change layer 214.

Figure 2D:
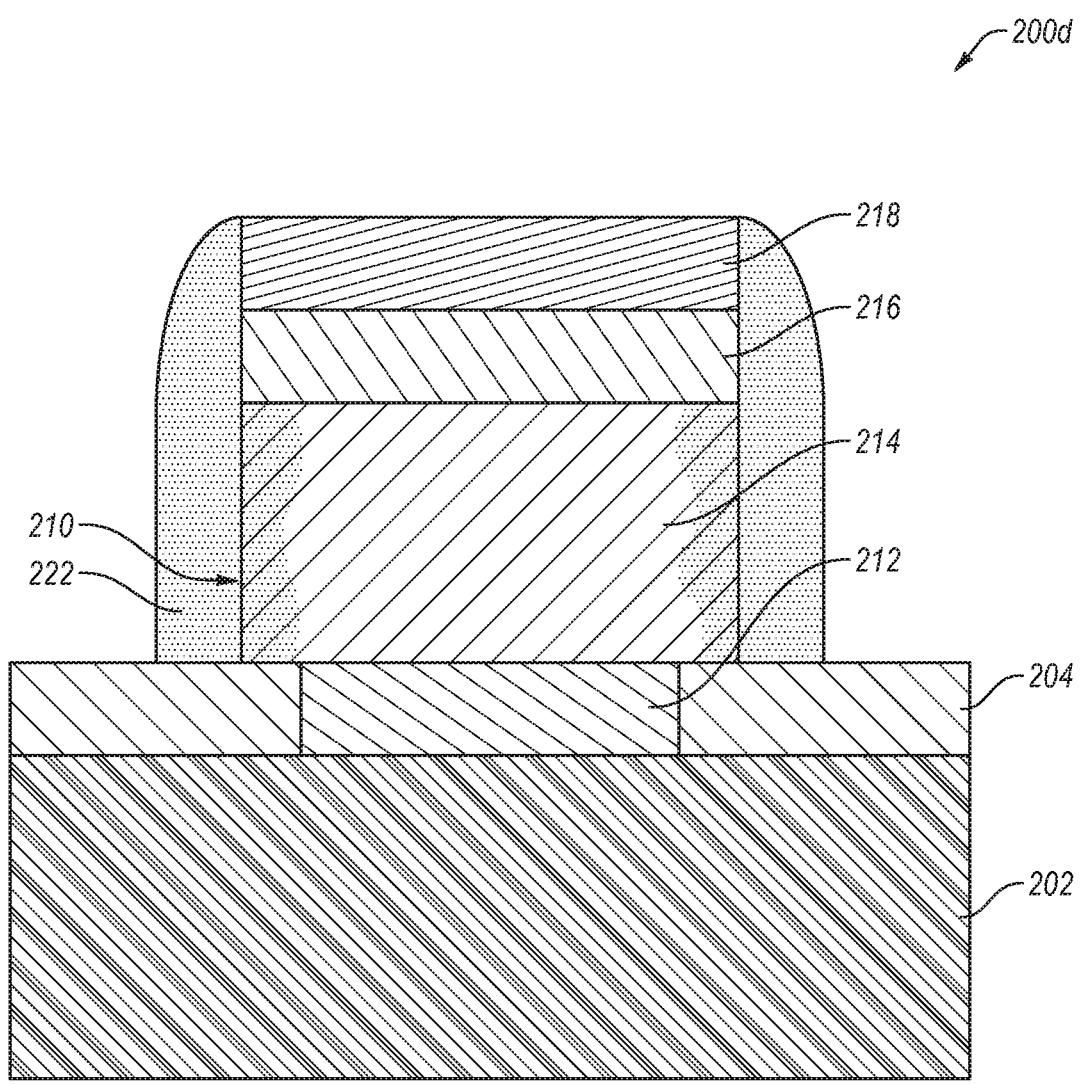
FIG. 2D sectional view of the evaporative material after etching during fabrication of a resistive change element.

FIG. 2D is a cross-sectional view of the evaporative material 222 after etching during fabrication of a resistive change element 200d arranged in accordance with at least one embodiment described in the present disclosure. The evaporative material 222 may be etched to remove portions of the evaporative material 222. For example, in some embodiments, the evaporative material 222 may be etched to remove portions of the evaporative material 222 that extend in a first plane parallel to the surface of the substrate 202 that is adjacent to the stack 210. In these and other embodiments, a portion of the evaporative material 222 that is in a second plane that is perpendicular to the plane parallel to the surface of the substrate 202 and also is in the first plane may not be removed. In these and other embodiments, the second plane may be parallel to the sidewalls of the stack 210. Thus, portions of the evaporative material 222 that cover the resistive change layer 214 may not be removed such that the sidewalls of the resistive change layer 214 are not exposed during the etching of the evaporative material 222.

In some embodiments, the evaporative material 222 may be etched to remove a portion of the evaporative material 222 that covers a top surface of the stack 210. The top surface of the stack may be parallel to the surface of the substrate 202 adjacent the stack 210 and furthest surface of the stack 210 from the substrate 202. As such, the etching of the evaporative material 222 may expose the top surface of the stack 210. As a result, the etching of the evaporative material 222 may expose the second insulation layer 218. Alternately or additionally, if the stack 210 does not include the second insulation layer 218, the etching of the evaporative material 222 may expose the second conductive layer 216.

In some embodiments, the evaporative material 222 may be etched to remove a portion of the evaporative material 222 that covers the sidewalls of the stack 210. For example, the portion of the evaporative material 222 that covers the sidewalls of the stack 210 may be etched to reduce a thickness of the evaporative material 222 that extends away from the sidewall of the stack 210.

Alternately or additionally, in some embodiments, the evaporative material 222 may be etched to expose a portion of the sidewall of the stack 210. For example, a portion of the sidewall of the stack 210 that is furthest from the substrate 202 may be exposed during the etching of the evaporative material 222. Alternately or additionally, the evaporative material 222 at the portion of the sidewall of the stack 210 furthest from the substrate 202 may be etched to have a thickness that is less than a thickness of the evaporative material 222 at the portion of the sidewall of the stack 210 that is closest to the substrate 202. As such, the thickness of the evaporative material 222 may taper along the sidewalls of the stack 210. In these and other embodiments, the evaporative material 222 may taper along the sidewalls of the second insulation layer 218 and/or the second conductive layer 216.

In these and other embodiments, the evaporative material 222 may be etched such that a thickness of the evaporative material 222 along the sidewalls of the resistive change layer 214 is maintained at a particular thickness that is based on the semiconductor processes being used to fabricate the resistive change element 200d. For example, the particular thickness may be larger for a 40 nm semiconductor process than a 20 nm semiconductor process.

Modifications, additions, or omissions may be made to the resistive change element 200d without departing from the scope of the present disclosure.

Figure 2E:
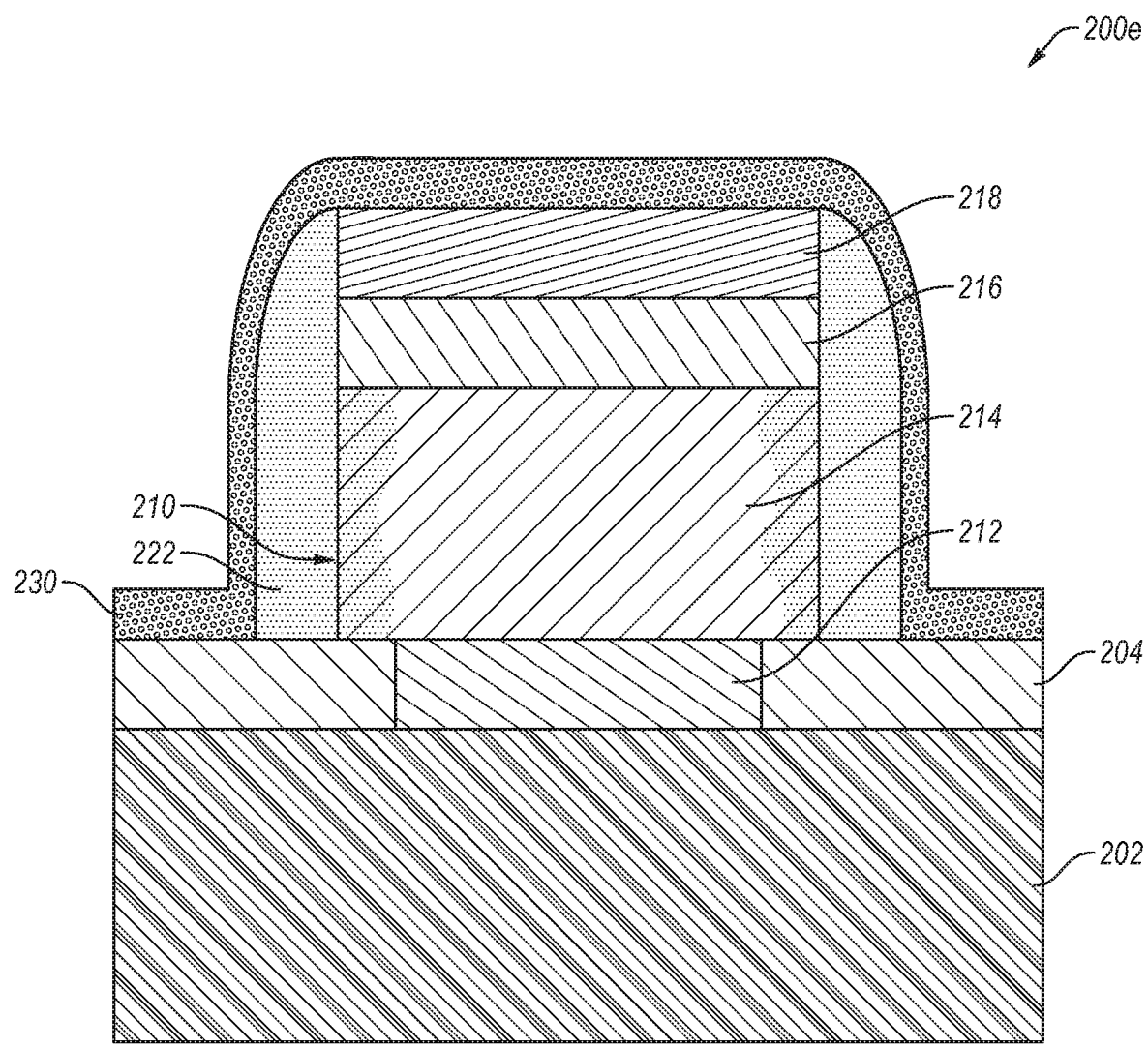
FIG. 2E is a cross-sectional view of a cover material over the etched evaporative material of FIG. 2D during fabrication of a resistive change element.

FIG. 2E is a cross-sectional view of a cover layer 230 over the etched evaporative material of FIG. 2D during fabrication of a resistive change element 200e arranged in accordance with at least one embodiment described in the present disclosure. The cover layer 230 may be deposited over the stack 210, the evaporative material 222, and the first insulation layer 204. The cover layer 230 may be configured to cover the evaporative material 222 and to allow the evaporative material 222 to be removed through the cover layer 230 through evaporation of the evaporative material 222.

In some embodiments, the cover layer 230 may be deposited by any one of a number of deposition techniques, include PVD, CVD, VPE, or other deposition techniques depending on the type of material used for the cover layer 230. In these and other embodiments, the cover layer 230 may be deposited at a temperature that is less than a temperature that may cause evaporation of the evaporative material 222. In these and other embodiments, the temperature at which the cover layer 230 is deposited may be less than a temperature at which the evaporative material 222 is deposited. As such, the cover layer 230, which may be further from the substrate 202 than the evaporative material 222 when deposited, may be deposited at a lower temperature. In these and other embodiments, the temperature of deposition of the cover layer 230 may be at a temperature less than 350 degree Celsius. Alternately or additionally, the deposition of the cover layer 230 may be at a temperature less than 300 degree Celsius.

The cover layer 230 may be formed by a material that is stable at temperatures higher than the deposition temperature. By being stable at temperature higher than the deposition temperature, the cover layer 230 may be deposited without causing evaporation of the evaporative material 222 and may not be disturbed when a higher temperature when the deposition temperature is used to cause evaporation of the evaporative material 222 through the cover layer 230. Alternately or additionally, the cover layer 230 may be formed by a material that may be porous. In these and other embodiments, the pores may be large enough to allow evaporation of the evaporative material 222 through the pores of the cover layer 230. In some embodiments, the cover layer 230 may be formed by a low temperature oxide, such as silicon oxide, silicon nitride, or other material that may meet the criteria described in this disclosure for the cover layer 230.

In some embodiments, the cover layer 230 may be deposited at a thickness that is less than a thickness of the evaporative material 222 after etching of the evaporative material 222. Alternately or additionally, the cover layer 230 may be deposited at a thickness that is approximately equal to a thickness of the evaporative material 222 after etching of the evaporative material 222. Alternately or additionally, the cover layer 230 may be deposited at a thickness that is greater than a thickness of the evaporative material 222 after etching of the evaporative material 222.

Modifications, additions, or omissions may be made to the resistive change element 200e without departing from the scope of the present disclosure.

Figure 2F:
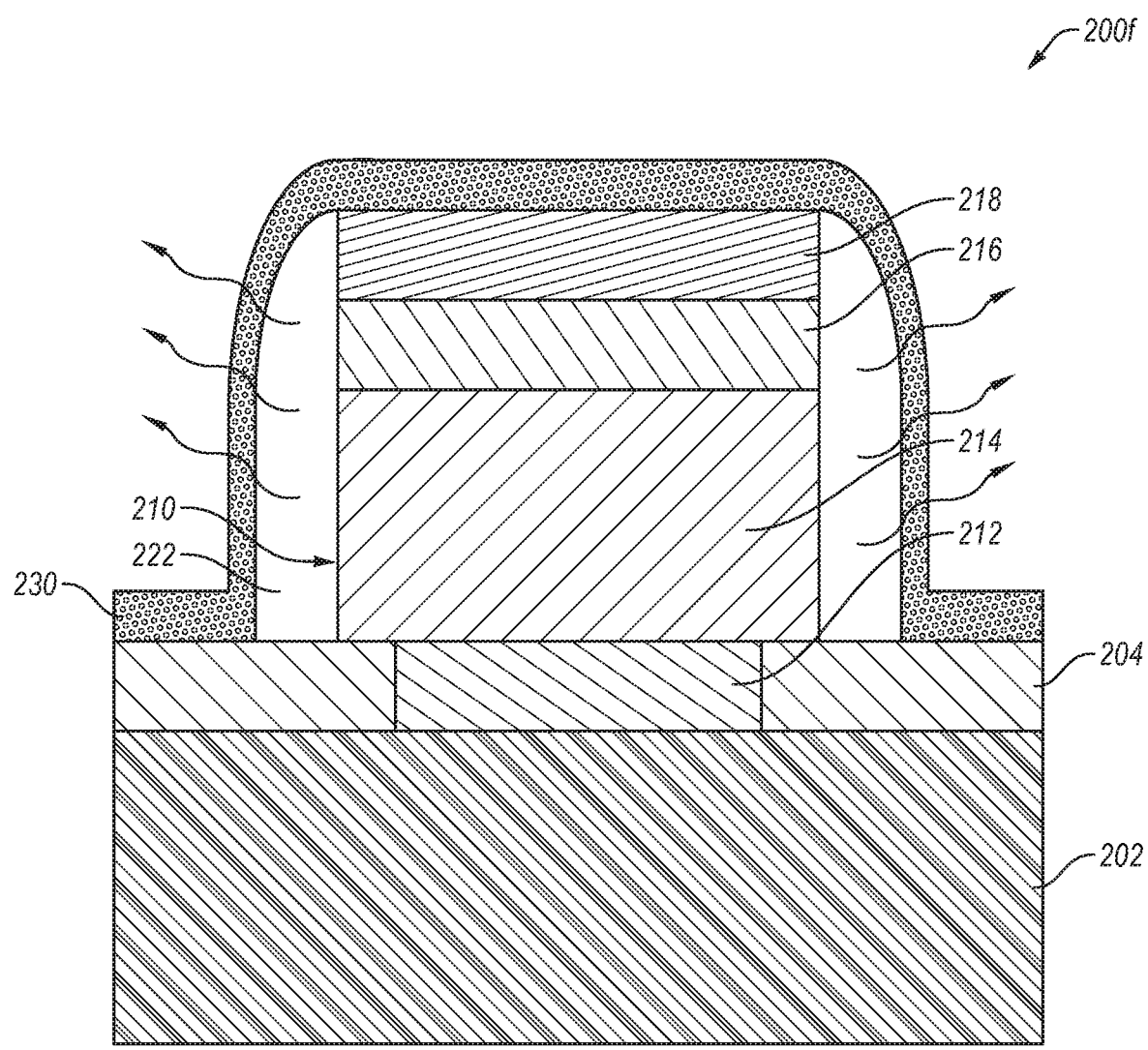
FIG. 2F is a cross-sectional view after removal of the etched evaporative material during fabrication of a resistive change element.

FIG. 2F is a cross-sectional view after removal of the etched evaporative material 222 during fabrication of a resistive change element 200f arranged in accordance with at least one embodiment described in the present disclosure. Some or all of the evaporative material 222 may be removed through the cover layer 230 by evaporation of the evaporative material 222 through the cover layer 230. For example, the evaporative material 222 may be evaporated through pores of the cover layer 230.

In some embodiments, the evaporative material 222 may be evaporated through the cover layer 230 by heating the resistive change element 200f to a temperature above the evaporative temperature of the evaporative material 222. For example, the resistive change element 200f may be heated to a temperature in a range between 300 and 500 degrees Celsius. Alternately or additionally, the temperature may be in a range between 300 and 450 degrees Celsius, between 300 and 400 degrees Celsius, between 300 and 375 degrees Celsius, between 325 and 375 degrees Celsius, or between 335 and 365 degrees Celsius, among other temperature ranges between 300 and 500 degrees Celsius. The temperature used to evaporate the evaporative material 222 may be at a temperature at which the cover layer 230 is stable. As such, evaporation of the evaporative material 222 may not disturb the cover layer 230.

Removal of the evaporative material 222 may result in a gap 220 between the stack 210 and the cover layer 230. The gap 220 may include air or may be a vacuum. A shape and location of the gap 220 may correspond to a shape and a location of the evaporative material 222 that is removed. In some embodiments, all of the evaporative material 222 may be removed. Alternately or additionally, some of the evaporative material 222 may remain after removal of the evaporative material 222. For example, some of the evaporative material 222 along the sidewalls of the stack 210 and/or that penetrated into the resistive change layer 214 may remain after removal of the evaporative material 222. Modifications, additions, or omissions may be made to the resistive change element 200f without departing from the scope of the present disclosure.

Figure 2G:
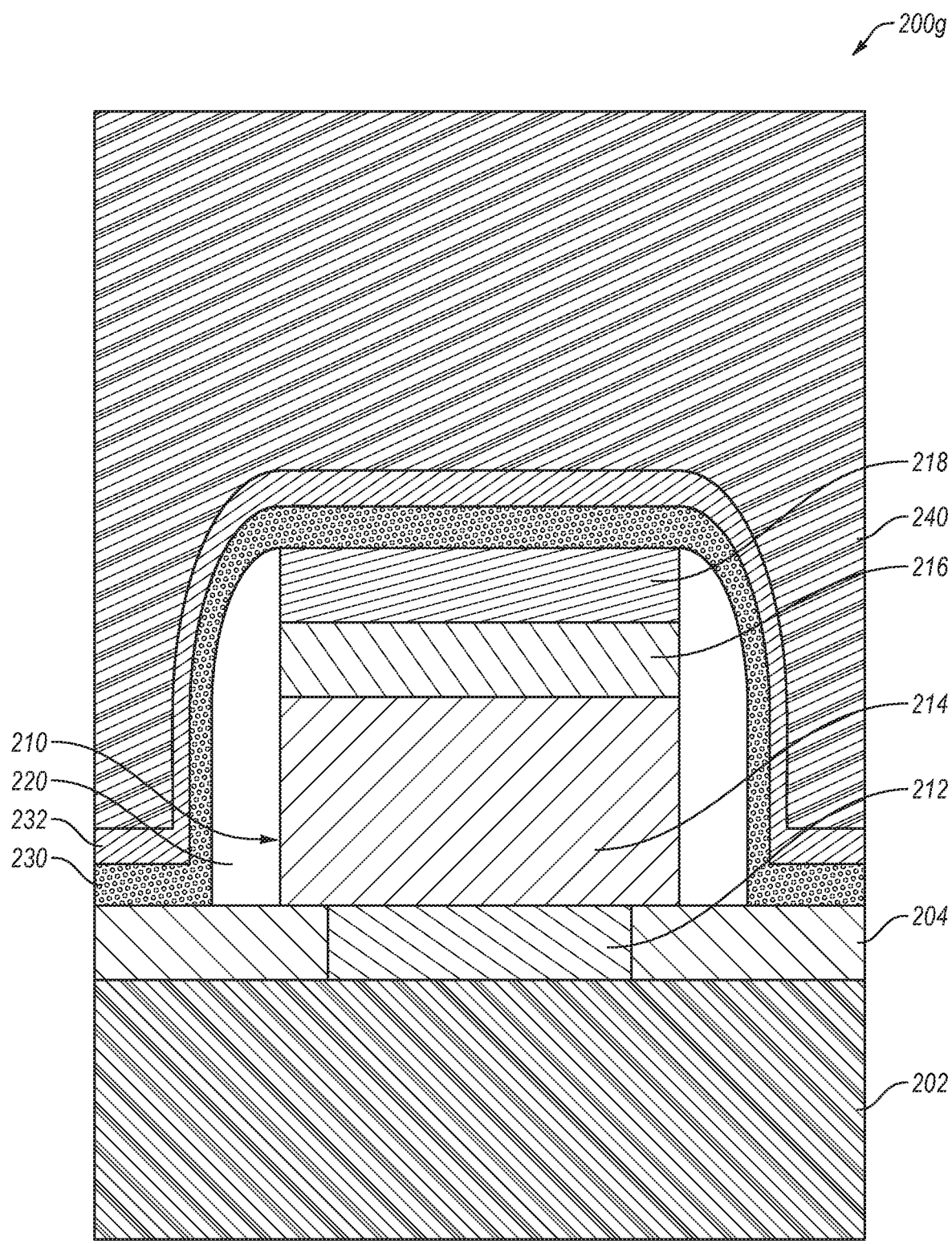
FIG. 2G is a cross-sectional view of insulative materials over the stack during fabrication of a resistive change element.

FIG. 2G is a cross-sectional view of insulative materials over the stack during fabrication of a resistive change element 200g arranged in accordance with at least one embodiment described in the present disclosure. The resistive change element 200g may include a third insulation layer 232 formed over the cover layer 230. The resistive change element 200g may further include a fourth insulation layer 240 formed over the fourth insulation layer 240.

In some embodiments, the third insulation layer 232 may be formed such that the cover layer 230 is between the third insulation layer 232 and the substrate 202. In these and other embodiments, the third insulation layer 232 may be formed such that the third insulation layer 232 is in direct contact with the cover layer 230.

In some embodiments, the fourth insulation layer 240 may be formed such that the third insulation layer 232 is between the fourth insulation layer 240 and the cover layer 230. In these and other embodiments, the fourth insulation layer 240 may be formed such that the fourth insulation layer 240 is in direct contact with the third insulation layer 232.

In some embodiments, the fourth insulation layer 240 may be formed to have a variable thickness. For example, a portion of the fourth insulation layer 240 directly adjacent the top surface of the stack 210 that is perpendicular to the sidewalls of the stack 210 may have a thickness less than a thickness than other portions of the fourth insulation layer 240. In these and other embodiments, the other portions of the fourth insulation layer 240 may include a thickness that is greater than the thickness of the stack 210, the cover layer 230, and the third insulation layer 232. Alternately or additionally, the portion of the fourth insulation layer 240 directly adjacent a top surface of the stack 210 may include a thickness that is greater than the thickness of the stack 210, the cover layer 230, and the third insulation layer 232.

The fourth insulation layer 240 may be configured to separate the stack 210 from additional materials and/or elements. For example, the additional materials and/or elements may include conductors, such as metals layers, transistors, capacitors, electrodes, insulators, or any of a variety of components, that may be formed in conjunction with the resistive change element 200g. For example, the additional materials and/or elements may be conductors that may be used as bit lines and components for electrically accessing the resistive change element 200g.

The third insulation layer 232 and the fourth insulation layer 240 may be deposited by any one of a number of deposition techniques, include PVD, CVD, VPE, or other deposition techniques. The third insulation layer 232 and the fourth insulation layer 240 may be formed by one or more insulation materials. The insulation materials may be silicon dioxide ($SiO_2$), silicon nitride ($SiN_X$), a silicate glass (doped or un-doped), other suitable dielectric material such as a low dielectric constant (i.e., low-k) material, or combinations thereof.

Modifications, additions, or omissions may be made to the resistive change element 200g without departing from the scope of the present disclosure. For example, the third insulation layer 232 may not be included. Alternately or additionally, the resistive change element 200g may include additional insulative materials or other materials between the cover layer 230 and the fourth insulation layer 240.

Figure 2H:
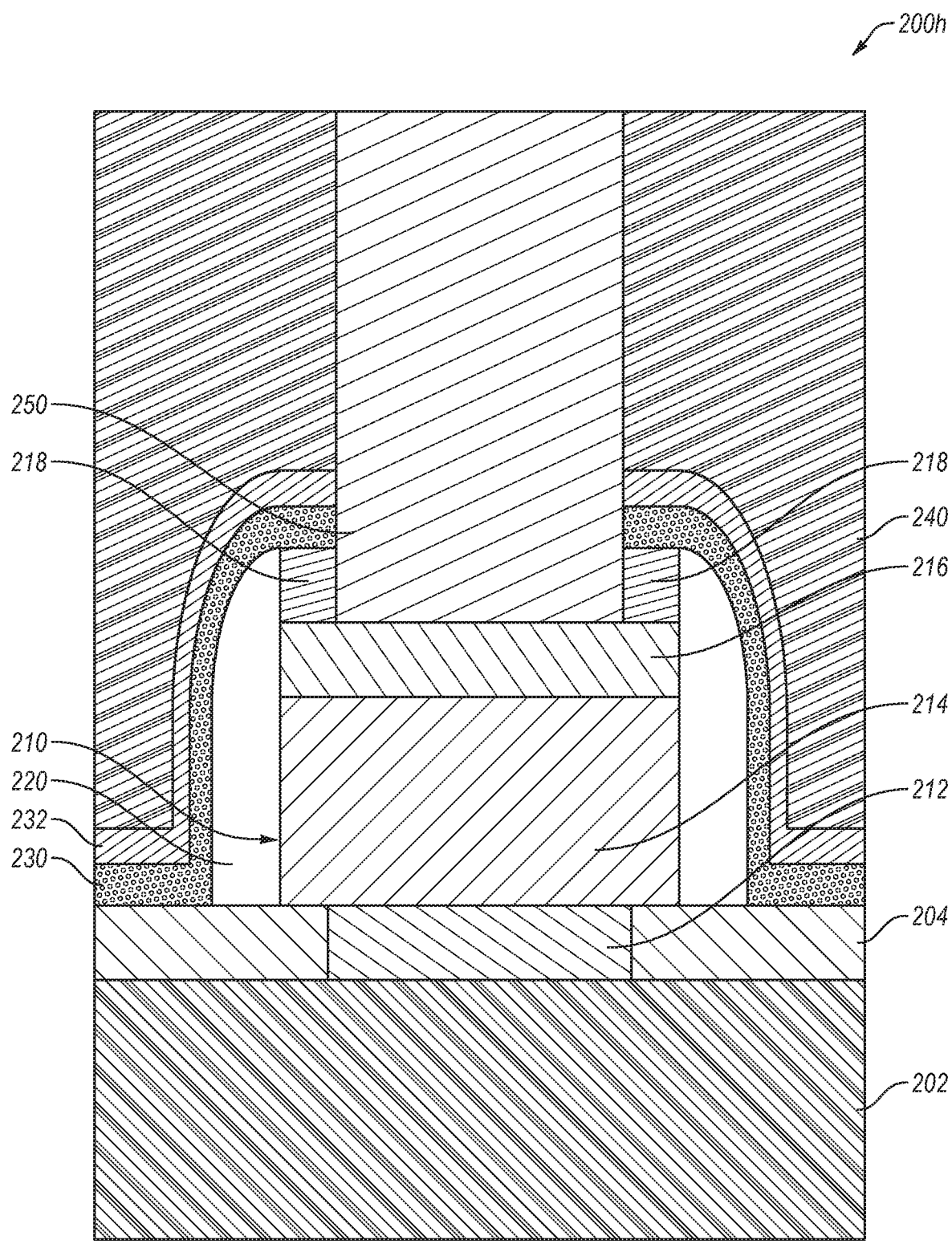
FIG. 2H is a cross-sectional view of a resistive change element.

FIG. 2H is a cross-sectional view of a resistive change element 200h arranged in accordance with at least one embodiment described in the present disclosure. The resistive change element 200h may include a conductive material 250 that may be directly electrically coupled with the second conductive layer 216.

The conductive material 250 may be formed in an opening that may be formed through the fourth insulation layer 240, the third insulation layer 232, the cover layer 230, and the second insulation layer 218. For example, one or more mask materials, such as resists or hard mask materials, may be formed on the fourth insulation layer 240. The mask materials may be shaped using one or more lithography process and photomasks.

After shaping the mask materials, the opening may be formed by etching the fourth insulation layer 240, the third insulation layer 232, the cover layer 230, and the second insulation layer 218. In some embodiments, the etching may be performed using a reactive ion etch (ME), or a chemical etch. Alternately or additionally, different etching processes may be used to etch the stack 210. For example, a first etching process with a first mask may be used to etch the third insulation layer 232 and the fourth insulation layer 240. A second etching process with a second mask may be used to etch the cover layer 230. Alternately or additionally, a different etching process and masks may be used to etch the second insulation layer 218. The masks and etching process may vary based on the materials used in the fourth insulation layer 240, the third insulation layer 232, the cover layer 230, and the second insulation layer 218. The etching processes may be wet, dry, or isotropic etching processes, among other types of etching processes.

After creating the opening, the conductive material 250 may be deposited into the opening to directly contact the resistive change layer 214. As such, the conductive material 250 may form a conductive via that may be used to electrically access the resistive change layer 214.

The conductive material 250 may be formed of a conductive material, such as titanium nitride TiN, Tantalum nitride TaN, Tungsten W, Cobalt C, and doped poly, among other conductive materials. The deposition process to form the conductive material 250 may be performed by CVD, PECVD, or ALD, among other deposition processes. After formation of the conductive material 250, the resistive change element 200g may be planarized. The planarization may be chemical-mechanical planarization (CMP) or another type of planarization technique.

Modifications, additions, or omissions may be made to the resistive change element 200h without departing from the scope of the present disclosure. For example, more than one conductive material may be formed in the opening.

Figure 3:
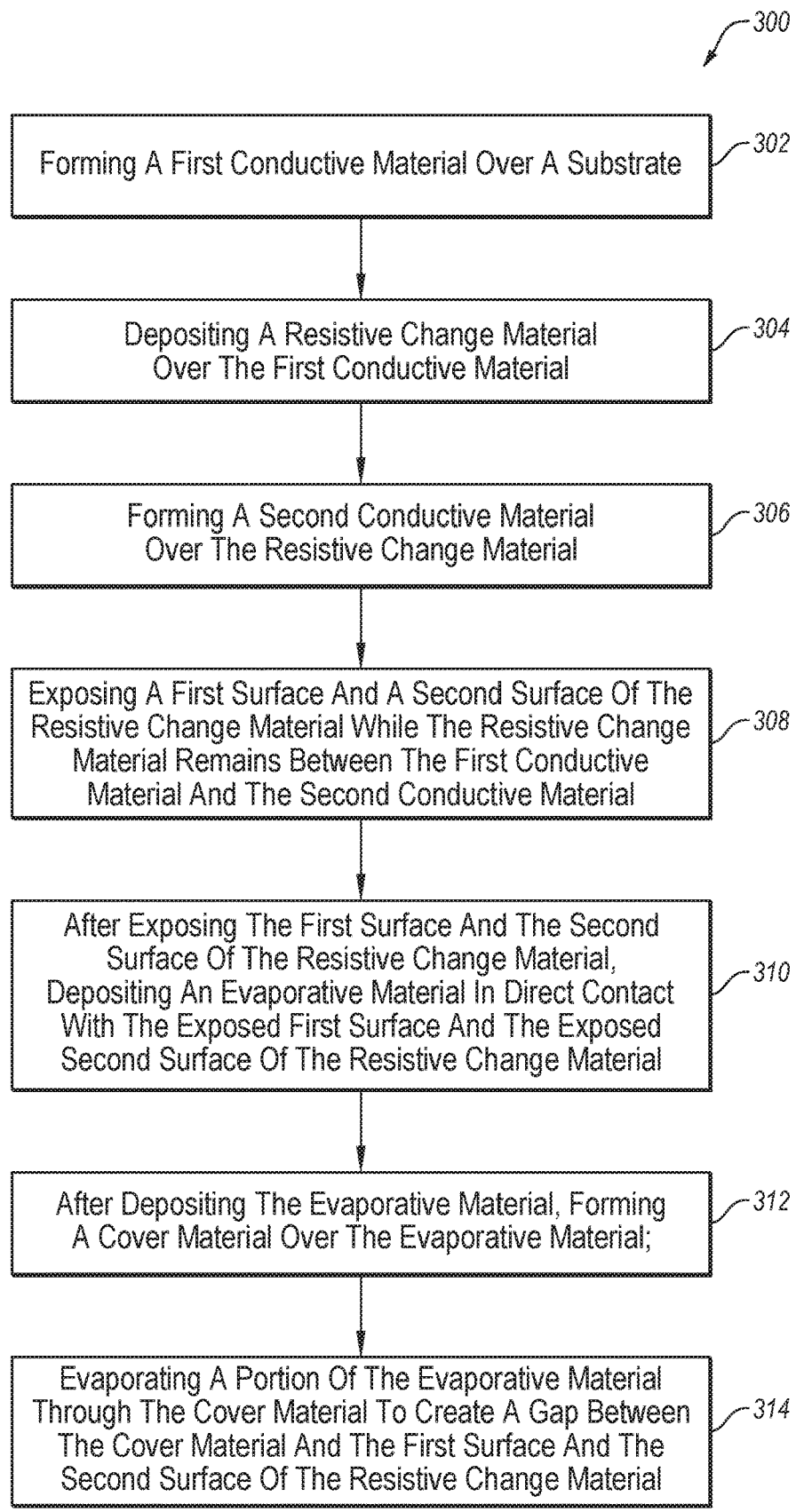
FIG. 3 illustrates a flowchart of an example method to fabricate a resistive change element.

FIG. 3 illustrates a flowchart of an example method 300 to fabricate a resistive change element array. The method 300 may be arranged in accordance with at least one embodiment described in the present disclosure. Although illustrated as discrete blocks, various blocks may be divided into additional blocks, combined into fewer blocks, or eliminated, depending on the desired implementation.

The method 300 may begin at block 302, where a first conductive material may be formed over a substrate. At block 304, a resistive change material may be deposited over the first conductive material. In some embodiments, the resistive change material may be a nanotube fabric and the resistive change material me be deposited by a spin coating operation. At block 306, a second conductive material may be formed over the resistive change material.

At block 308, a first surface and a second surface of the resistive change material may be exposed while the resistive change material remains between the first conductive material and the second conductive material. In some embodiments, exposing the first surface and the second surface of the resistive change material may include etching the second conductive material and the resistive change material to expose the first surface and a second surface of the resistive change material. In these and other embodiments, the first surface and the second surfaces may be sidewalls of the resistive change material.

At block 310, after exposing the first surface and the second surface of the resistive change material, an evaporative material may be deposited in direct contact with the exposed first surface and the exposed second surface of the resistive change material. In some embodiments, depositing the evaporative material may include depositing the evaporative material into a portion of the resistive change material.

At block 312, after depositing the evaporative material, a cover material may be formed over the evaporative material. In some embodiments, the evaporative material may be a polymer material and the cover material may be an oxide material.

At block 314, a portion of the evaporative material may be evaporated through the cover material to create a gap between the cover material and the first surface and the second surface of the resistive change material. In some embodiments, forming the cover material may be performed at a first temperature and evaporating the portion of the evaporative material may be performed at a second temperature. In these and other embodiments, the first temperature may be lower than the second temperature. In some embodiments, the portion of the evaporative material that evaporates may include the evaporative material in the portion of the resistive change material.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 300 may further include depositing a second resistive change material between the resistive change material and the second conductive material.

As another example, the method 300 may further include etching the evaporative material before forming the cover material. In some embodiments, etching the evaporative material may result in a thickness of the evaporative material in direct contact with the second conductive material being less than a thickness of the evaporative material in direct contact with the resistive change material.

As another example, the method 300 may further include forming a second insulative material over the cover material and depositing a third insulative material over the second insulative material. In these and other embodiments, the second insulative material may be different from the third insulative material. The method 300 may also include forming an opening through the third insulative material, the second insulative material, the cover material, and the insulative material to expose the second conductive material and flowing a third conductive material into the opening. In these and other embodiments, the second conductive material may form an electrode for the memory element.

As another example, the method 300 may further include forming an insulator material over the second conductive material such that the insulator material is between the second conductive material and the evaporative material. In these and other embodiments, etching the evaporative material may include exposing the insulator material such that the cover material directly contacts the insulator material.

Figure 4:
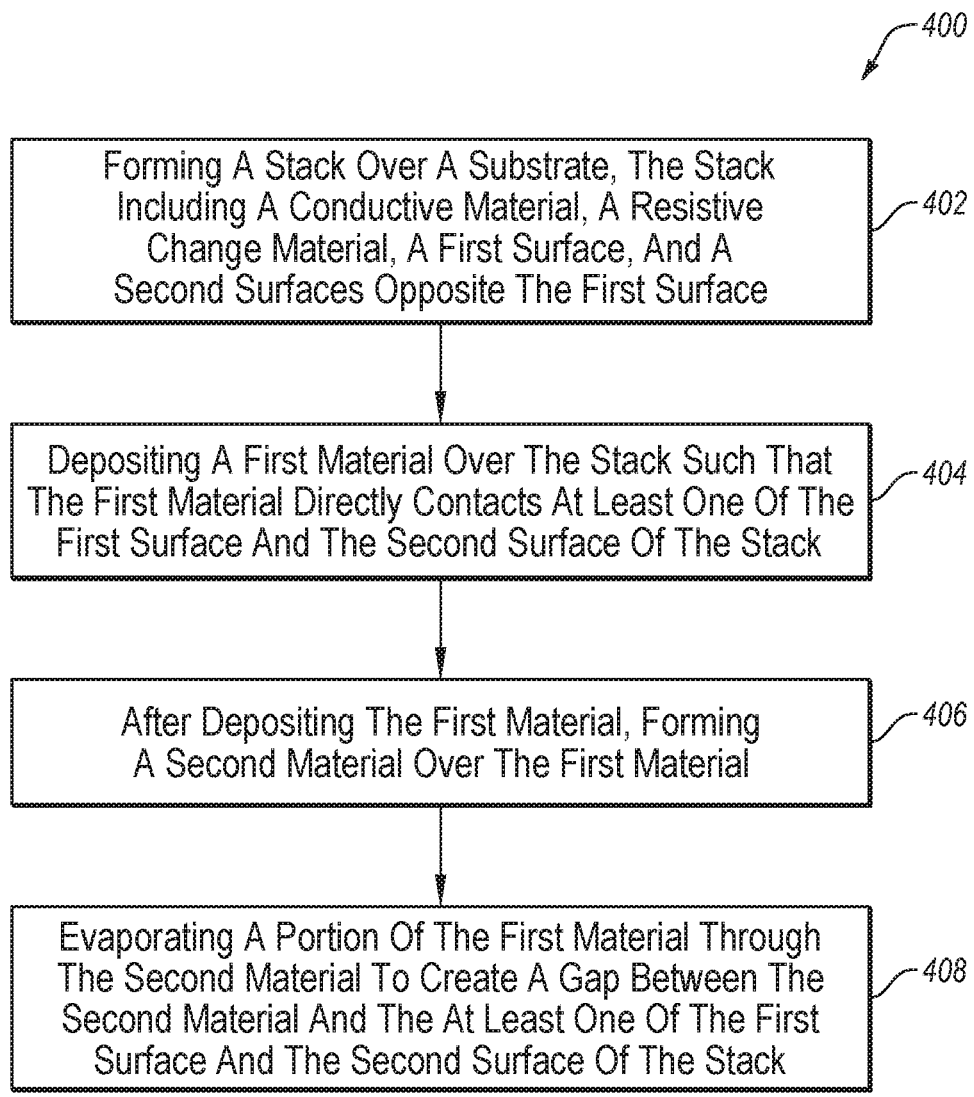
FIG. 4 illustrates a flowchart of another example method to fabricate a resistive change element.

FIG. 4 illustrates a flowchart of another example method 400 to fabricate a resistive change element array. The method 400 may be arranged in accordance with at least one embodiment described in the present disclosure. Although illustrated as discrete blocks, various blocks may be divided into additional blocks, combined into fewer blocks, or eliminated, depending on the desired implementation.

The method 400 may begin at block 402, where a stack may be formed over a substrate.

The stack may include a conductive material, a resistive change material, a first surface, and a second surfaces opposite the first surface. In some embodiments, the resistive change material may be a nanotube fabric and the resistive change material may be deposited by a spin coating operation.

At block 404, a first material may be deposited over the stack such that the first material directly contacts at least one of the first surface and the second surface of the stack.

At block 406, after depositing the first material, a second material may be formed over the first material. In some embodiments, the first material may be a polymer material and the second material may be an oxide material.

At block 408, a portion of the first material may be evaporated through the second material to create a gap between the second material and the at least one of the first surface and the second surface of the stack. In some embodiments, air or a vacuum may be in the gap between the second material and the at least one of the first surface and the second surface of the stack.

In some embodiments, forming the second material may be performed at a first temperature, evaporating the portion of the first material may be performed at a second temperature, and the first temperature may be lower than the second temperature. In some embodiments, depositing the first material over the stack may include depositing the first material into a portion of the resistive change material and the portion of the first material evaporated may include the first material in the portion of the resistive change material.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, the method 400 may further include etching the first material before depositing the second material. In these and other embodiments, the etching may include removing the first material from a third surface of the stack to expose the third surface of the stack. In some embodiments, the stack may be formed over a first surface of the substrate. In these and other embodiments, the third surface of the stack may be substantially parallel to the first surface of the substrate and the first surface and the second surface of the stack may be substantially perpendicular to the first surface of the substrate.

In some embodiments of the method 400, the conductive material may be a first electrode of the resistive change element. In these and other embodiments, the method 400 may further include forming a second electrode on a first side of the resistive change element that is opposite a second side of the resistive change element adjacent to the first electrode and depositing a second resistive change material between the first electrode and the second electrode. The method 400 may also include forming an insulator material over the first electrode such that the first electrode is between the second resistive change material and the insulator material and the first material is deposited over the insulator material.

Figure 5A:
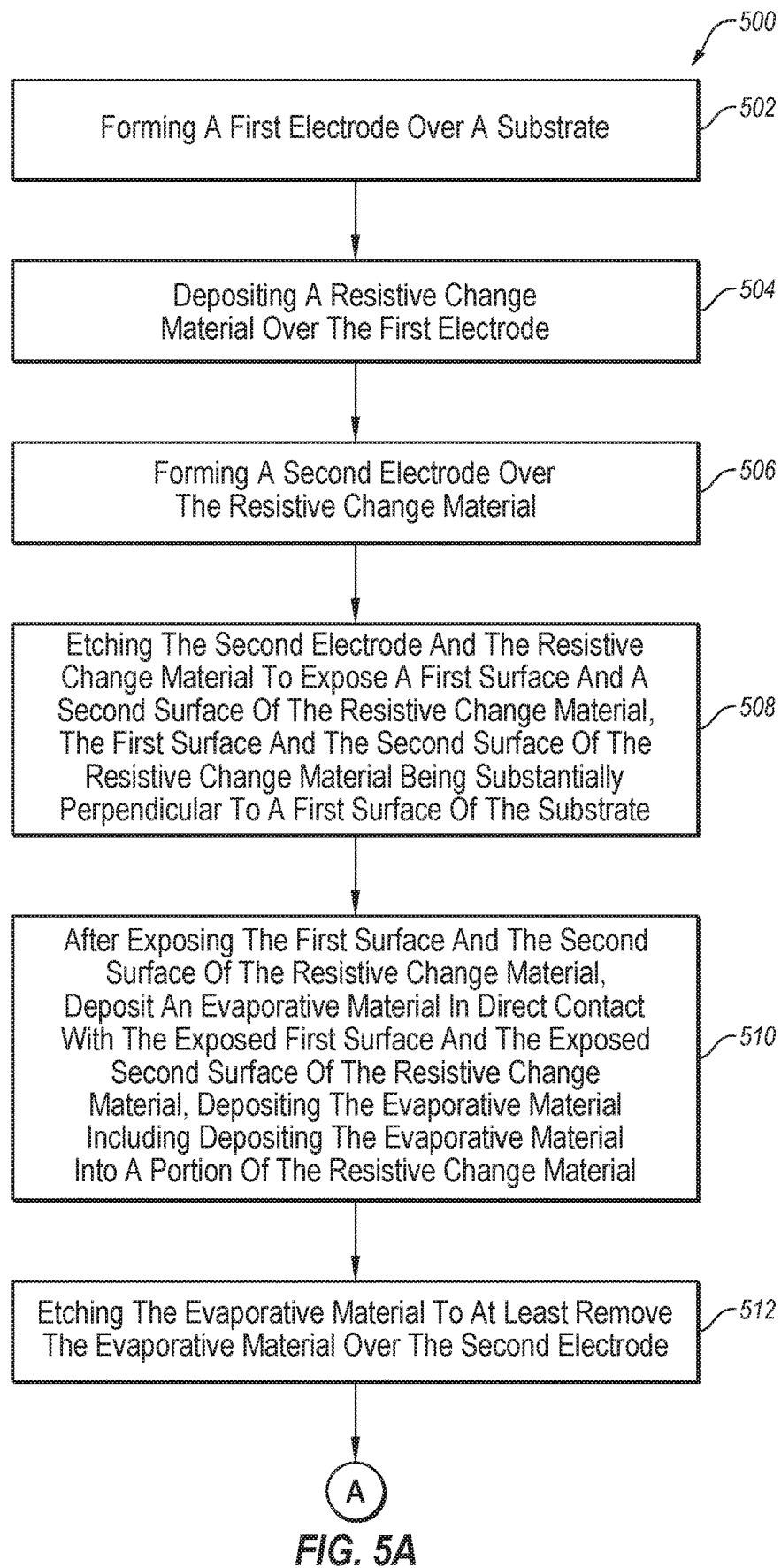
FIGS. 5A and 5B include a flowchart of another example method to fabricate a resistive change element.
Figure 5B:
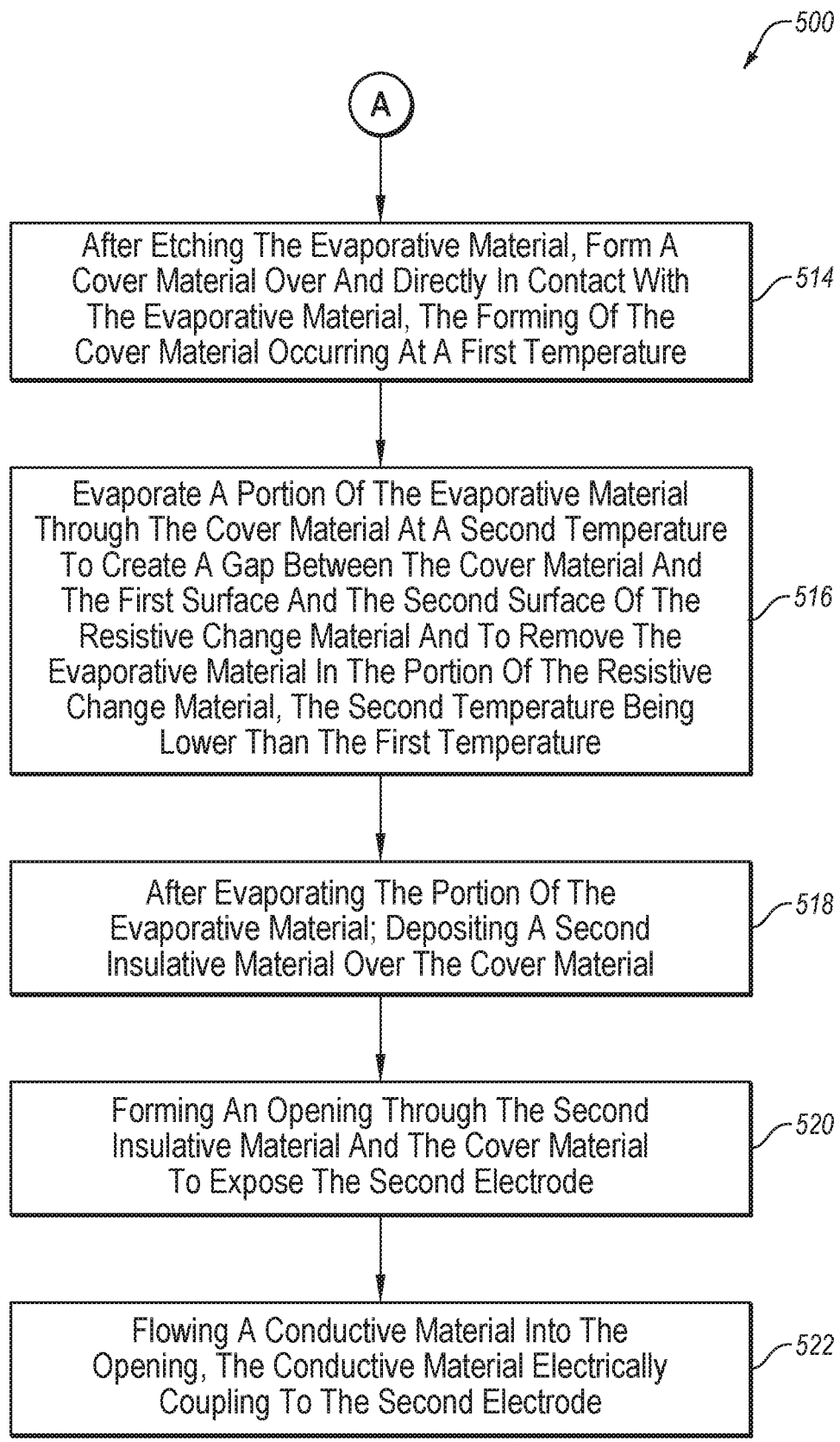

FIGS. 5A and 5B include a flowchart of an example method 500 to fabricate a resistive change element array. The method 500 may be arranged in accordance with at least one embodiment described in the present disclosure. Although illustrated as discrete blocks, various blocks may be divided into additional blocks, combined into fewer blocks, or eliminated, depending on the desired implementation.

The method 500 may begin at block 502, where a first electrode may be formed over a substrate. At block 504, a resistive change material may be deposited over the first electrode. At block 506, a second electrode may be formed over the resistive change material.

At block 508, the second electrode and the resistive change material may be etched to expose a first surface and a second surface of the resistive change material. In these and other embodiments, the first surface and the second surface of the resistive change material may be substantially perpendicular to a first surface of the substrate.

At block 510, after exposing the first surface and the second surface of the resistive change material, an evaporative material may be deposited in direct contact with the exposed first surface and the exposed second surface of the resistive change material. In these and other embodiments, depositing the evaporative material may include depositing the evaporative material into a portion of the resistive change material.

At block 512, the evaporative material may be etched to at least remove the evaporative material over the second electrode. At block 514, after etching the evaporative material, a cover material may be formed over and directly in contact with the evaporative material. In some embodiments, forming of the cover material may occur at a first temperature.

At block 516, a portion of the evaporative material may be evaporated through the cover material to create a gap between the cover material and the first surface and the second surface of the resistive change material and to remove the evaporative material in the portion of the resistive change material. The evaporation of the evaporative material may occur at a second temperature that is higher than the first temperature.

At block 518, after evaporating the portion of the evaporative material; a second insulative material may be deposited over the cover material. At block 520, an opening may be formed through the second insulative material and the cover material to expose the second electrode. At block 522, a conductive material may be flowed into the opening. The conductive material may be electrically coupled to the second electrode.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

Figure 6:
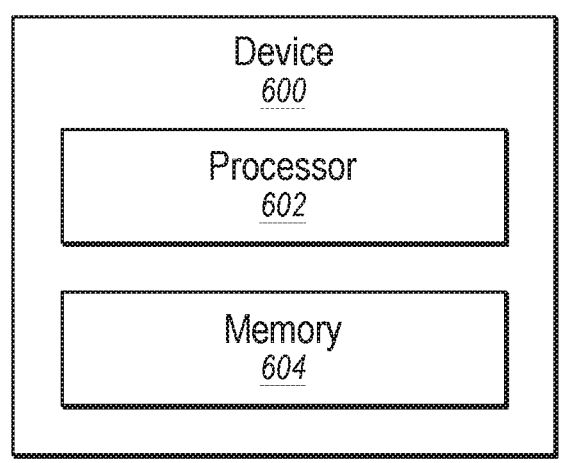
FIG. 6 illustrates an example system that may use a resistive change element.

FIG. 6 illustrates an example system 600 that may use a resistive change element array as described in this disclosure. The system 600 may include a processor 602 and memory 604. The system 600 may be any type of system or device, such as a desktop, laptop, cellphone, smart phone, smart watch, wearable device, server, automobile, airplane, drone, appliance, television, sound system, monitoring system, among any other system or device that uses a processor and memory.

Generally, the processor 602 may include any suitable special-purpose or general-purpose computer, computing entity, or processing device including various computer hardware or software modules and may be configured to execute instructions stored on any applicable computer-readable storage media. For example, the processor 602 may include a microprocessor, a microcontroller, a digital signal processor (DSP), an application-specific integrated circuit (ASIC), a Field-Programmable Gate Array (FPGA), graphics processing unit (GPU), vector or array processor, a SIMD (single instruction multiple data) or other parallel processor, or any other digital or analog circuitry configured to interpret and/or to execute program instructions and/or to process data.

Although illustrated as a single processor in FIG. 6, it is understood that the processor 602 may include any number of processors distributed across any number of networks or physical locations that are configured to perform individually or collectively any number of operations described herein. In some embodiments, the processor 602 may interpret and/or execute program instructions and/or process data stored in the memory 604. In some embodiments, the processor 602 may execute the program instructions stored in the memory 604. The memory 604 may include a resistive change element as illustrated in FIGS. 1 and 2.

For clarity, technical material that is known in the technical fields related to the examples has not been described in detail to avoid unnecessarily obscuring the description. The described fabrication techniques may be varied and are not limited to the examples provided.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A method to fabricate a resistive change element, said method comprising:
    forming a stack over a substrate, said stack including a conductive material, a resistive change material, a first surface, and a second surfaces opposite said first surface;
    depositing a first material over said stack such that said first material directly contacts at least one of said first surface and said second surface of said stack;
    after depositing said first material, forming a second material over said first material; and
    evaporating a portion of said first material through said second material to create a gap between said second material and said at least one of said first surface and said second surface of said stack.

2. The method of claim 1, said resistive change material is a nanotube fabric and said resistive change material is deposited by a spin coating operation.

3. The method of claim 1, wherein one of a gas or a vacuum is in said gap between said second material and said at least one of said first surface and said second surface of said stack.

4. The method of claim 1, wherein said first material is a polymer material and said second material is an oxide material.

5. The method of claim 1, wherein said forming said second material is performed at a first temperature, said evaporating said portion of said first material is performed at a second temperature, and said first temperature is lower than said second temperature.

6. The method of claim 1, further comprising etching said first material before depositing said second material, said etching including removing said first material from a third surface of said stack to expose said third surface of said stack.

7. The method of claim 6, wherein said stack is formed over a first surface of said substrate, said third surface of said stack is substantially parallel to said first surface of said substrate and said first surface and said second surface of said stack are substantially perpendicular to said first surface of said substrate.

8. The method of claim 1, wherein said conductive material is a first electrode of said resistive change element and said method further comprises:
   forming a second electrode on a first side of said resistive change element that is opposite a second side of said resistive change element adjacent to said first electrode;
   depositing a second resistive change material between said first electrode and said second electrode; and
   forming an insulator material over said first electrode such that said first electrode is between said second resistive change material and said insulator material and said first material is deposited over said insulator material.

9. The method of claim 1, wherein depositing said first material over said stack includes depositing said first material into a portion of said resistive change material and said portion of said first material evaporated includes said first material in said portion of said resistive change material.

10. A method to fabricate a memory element, said method comprising:
    forming a first conductive material over a substrate;
    depositing a resistive change material over said first conductive material;
    forming a second conductive material over said resistive change material;
    exposing a first surface and a second surface of said resistive change material while said resistive change material remains between said first conductive material and said second conductive material;
    after exposing said first surface and said second surface of said resistive change material, depositing an evaporative material in direct contact with said exposed first surface and said exposed second surface of said resistive change material;
    after depositing said evaporative material, forming a cover material over said evaporative material; and
    evaporating a portion of said evaporative material through said cover material to create a gap between said cover material and said first surface and said second surface of said resistive change material.

11. The method of claim 10, wherein exposing said first surface and said second surface of said resistive change material includes etching said second conductive material and said resistive change material to expose said first surface and a second surface of said resistive change material, said first surface and said second surfaces being sidewalls of said resistive change material.

12. The method of claim 11, wherein said depositing said evaporative material includes depositing said evaporative material into a portion of said resistive change material and said portion of said evaporative material that evaporates includes said evaporative material in said portion of said resistive change material.

13. The method of claim 12, said resistive change material is a nanotube fabric and said resistive change material is deposited by a spin coating operation.

14. The method of claim 12, further comprising etching said evaporative material before forming said cover material.

15. The method of claim 14, wherein etching said evaporative material results in a thickness of said evaporative material in direct contact with said second conductive material being less than a thickness of said evaporative material in direct contact with said resistive change material.

16. The method of claim 14, further comprising:
    forming a second insulative material over said cover material; and
    depositing a third insulative material over said second insulative material, wherein said second insulative material is different from said third insulative material.

17. The method of claim 16, further comprising:
    forming an opening through said third insulative material, said second insulative material, said cover material, and said insulative material to expose said second conductive material; and
    depositing a third conductive material into said opening, said second conductive material forming an electrode for said memory element.

18. The method of claim 14, further comprising forming an insulator material over said second conductive material such that said insulator material is between said second conductive material and said evaporative material.

19. The method of claim 18, wherein etching said evaporative material includes exposing said insulator material such that said cover material directly contacts said insulator material.

20. The method of claim 10, wherein said forming said cover material is performed at a first temperature, said evaporating said portion of said evaporative material is performed at a second temperature, and said first temperature is lower than said second temperature.

21. The method of claim 10, further comprising depositing a second resistive change material between said resistive change material and said second conductive material.

22. The method of claim 10, wherein said evaporative material is a polymer material and said cover material is an oxide material.

23. A method to fabricate a memory element, said method comprising:
    forming a first electrode over a substrate;
    depositing a resistive change material over said first electrode;
    forming a second electrode over said resistive change material;
    etching said second electrode and said resistive change material to expose a first surface and a second surface of said resistive change material, said first surface and said second surface of said resistive change material being substantially perpendicular to a first surface of said substrate;
    after exposing said first surface and said second surface of said resistive change material, depositing an evaporative material in direct contact with said exposed first surface and said exposed second surface of said resistive change material, depositing said evaporative material including depositing said evaporative material into a portion of said resistive change material;
    etching said evaporative material to at least remove said evaporative material over said second electrode;
    after etching said evaporative material, forming a cover material over and directly in contact with said evaporative material, said forming of said cover material occurring at a first temperature;
    evaporating a portion of said evaporative material through said cover material at a second temperature to create a gap between said cover material and said first surface and said second surface of said resistive change material and to remove said evaporative material in said portion of said resistive change material, the second temperature being higher than the first temperature;

after evaporating said portion of said evaporative material; depositing a second insulative material over said cover material;

forming an opening through said second insulative material and said cover material to expose said second electrode; and depositing a conductive material into said opening, the conductive material electrically coupling to said second electrode.

* * * * *